(12) United States Patent
Henson et al.

(10) Patent No.: US 12,348,228 B2
(45) Date of Patent: Jul. 1, 2025

(54) BIPOLAR HIGH VOLTAGE PULSER

(71) Applicant: EHT Ventures, LLC, Seattle, WA (US)

(72) Inventors: Alex Henson, Seattle, WA (US); Kevin Muggli, Mountlake Terrace, WA (US); Timothy Ziemba, Bainbridge Island, WA (US); Kenneth Miller, Seattle, WA (US)

(73) Assignee: EHT Ventures LLC, Seattle, WA (US)

( * ) Notice: Subject to any disclaimer, the term of this patent is extended or adjusted under 35 U.S.C. 154(b) by 0 days.

(21) Appl. No.: 18/512,002

(22) Filed: Nov. 16, 2023

(65) Prior Publication Data

US 2024/0088877 A1  Mar. 14, 2024

Related U.S. Application Data

(63) Continuation of application No. 17/853,891, filed on Jun. 29, 2022, now Pat. No. 11,824,542.

(51) Int. Cl.
*H03K 3/57* (2006.01)
*H02M 3/07* (2006.01)

(52) U.S. Cl.
CPC ............... *H03K 3/57* (2013.01); *H02M 3/07* (2013.01)

(58) Field of Classification Search
None
See application file for complete search history.

(56) References Cited

U.S. PATENT DOCUMENTS

| | | |
|---|---|---|
| 3,339,108 A | 8/1967 | Holtje |
| 4,070,589 A | 1/1978 | Martinkovic |
| 4,076,996 A | 2/1978 | Maehara et al. |
| 4,438,331 A | 3/1984 | Davis |
| 4,504,895 A | 3/1985 | Steigerwald |
| 4,692,851 A | 9/1987 | Attwood |
| 4,885,074 A | 12/1989 | Susko et al. |
| 4,924,191 A | 5/1990 | Erb et al. |
| 4,992,919 A | 2/1991 | Lee et al. |
| 5,038,051 A | 8/1991 | Firman et al. |
| 5,072,191 A | 12/1991 | Nakajima et al. |
| 5,118,969 A | 6/1992 | Ikezi et al. |
| 5,140,510 A | 8/1992 | Myers |
| 5,313,481 A | 5/1994 | Cook et al. |

(Continued)

FOREIGN PATENT DOCUMENTS

| | | |
|---|---|---|
| CA | 2292526 A1 | 12/1999 |
| CN | 101534071 A | 9/2009 |

(Continued)

OTHER PUBLICATIONS

Bland, M.J., et al., "A High Power RF Power Supply for High Energy Physics Applications," Proceedings of 2005 the Particle Accelerator Conference, IEEE pp. 4018-4020 (May 16-20, 2005).

(Continued)

*Primary Examiner* — Jeffrey S Zweizig

(57) ABSTRACT

A bipolar high voltage bipolar pulsing power supply is disclosed that can produce high voltage bipolar pulses with a positive high voltage pulse greater than about 2 kV followed by a negative high voltage pulse less than about −2 kV with a positive to negative dwell period between the positive high voltage pulse and the negative high voltage pulse. A high voltage bipolar pulsing power supply, for example, can reproduce high voltage pulses with a pulse repetition rate greater than about 10 kHz.

22 Claims, 13 Drawing Sheets

(56) References Cited

U.S. PATENT DOCUMENTS

| | | |
|---|---|---|
| 5,321,597 A | 6/1994 | Alacoque |
| 5,325,021 A | 6/1994 | Duckworth et al. |
| 5,392,043 A | 2/1995 | Ribner |
| 5,392,187 A | 2/1995 | Baliga |
| 5,418,707 A | 5/1995 | Shimer et al. |
| 5,451,846 A | 9/1995 | Peterson et al. |
| 5,483,731 A | 1/1996 | Prendel et al. |
| 5,488,552 A | 1/1996 | Sakamoto et al. |
| 5,610,452 A | 3/1997 | Shimer et al. |
| 5,623,171 A | 4/1997 | Nakajima |
| 5,629,844 A | 5/1997 | Krichtafovitch et al. |
| 5,656,123 A | 8/1997 | Salimian et al. |
| 5,729,562 A | 3/1998 | Birx et al. |
| 5,796,598 A | 8/1998 | Nowak et al. |
| 5,808,504 A | 9/1998 | Chikai et al. |
| 5,895,558 A | 4/1999 | Spence |
| 5,905,646 A | 5/1999 | Crewson et al. |
| 5,930,125 A | 7/1999 | Hitchcock et al. |
| 5,933,335 A | 8/1999 | Hitchcock et al. |
| 5,947,300 A | 9/1999 | Lange |
| 5,968,377 A | 10/1999 | Yuasa et al. |
| 6,059,935 A | 5/2000 | Spence |
| 6,066,901 A | 5/2000 | Burkhart et al. |
| 6,087,871 A | 7/2000 | Kardo-Syssoev et al. |
| 6,205,074 B1 | 3/2001 | Van Buskirk et al. |
| 6,222,321 B1 | 4/2001 | Scholl et al. |
| 6,233,161 B1 | 5/2001 | Balakrishnan et al. |
| 6,238,387 B1 | 5/2001 | Miller, III |
| 6,239,403 B1 | 5/2001 | Dible et al. |
| 6,252,354 B1 | 6/2001 | Collins et al. |
| 6,253,704 B1 | 7/2001 | Savas |
| 6,300,720 B1 | 10/2001 | Birx |
| 6,359,542 B1 | 3/2002 | Widmayer et al. |
| 6,362,604 B1 | 3/2002 | Cravey |
| 6,392,187 B1 | 5/2002 | Johnson |
| 6,416,638 B1 | 7/2002 | Kuriyama et al. |
| 6,480,399 B2 | 11/2002 | Balakrishnan et al. |
| 6,483,731 B1 | 11/2002 | Isurin et al. |
| 6,496,047 B1 | 12/2002 | Iskander et al. |
| 6,518,195 B1 | 2/2003 | Collins et al. |
| 6,577,135 B1 | 6/2003 | Matthews et al. |
| 6,741,120 B1 | 5/2004 | Tan |
| 6,741,484 B2 | 5/2004 | Crewson et al. |
| 6,815,633 B1 | 11/2004 | Chen et al. |
| 6,831,377 B2 | 12/2004 | Yampolsky et al. |
| 6,897,574 B2 | 5/2005 | Vaysse |
| 6,947,300 B2 | 9/2005 | Pai et al. |
| 7,061,230 B2 | 6/2006 | Kleine et al. |
| 7,180,082 B1 | 2/2007 | Hassanein et al. |
| 7,256,637 B2 | 8/2007 | Iskander et al. |
| 7,291,545 B2 | 11/2007 | Collins et al. |
| 7,307,375 B2 | 12/2007 | Smith et al. |
| 7,319,579 B2 | 1/2008 | Inoue et al. |
| 7,354,501 B2 | 4/2008 | Gondhalekar et al. |
| 7,393,765 B2 | 7/2008 | Hanawa et al. |
| 7,396,746 B2 | 7/2008 | Walther et al. |
| 7,492,138 B2 | 2/2009 | Zhang et al. |
| 7,512,433 B2 | 3/2009 | Bernhart et al. |
| 7,521,370 B2 | 4/2009 | Hoffman |
| 7,549,461 B2 | 6/2009 | Kroliczek et al. |
| 7,601,619 B2 | 10/2009 | Okumura et al. |
| 7,605,385 B2 | 10/2009 | Bauer |
| 7,615,931 B2 | 11/2009 | Hooke et al. |
| 7,767,433 B2 | 8/2010 | Kuthi et al. |
| 7,901,930 B2 | 3/2011 | Kuthi et al. |
| 7,936,544 B2 | 5/2011 | Beland |
| 7,943,006 B2 | 5/2011 | Hoffman |
| 7,948,185 B2 | 5/2011 | Smith et al. |
| 7,989,987 B2 | 8/2011 | McDonald |
| 8,093,797 B2 | 1/2012 | Tyldesley |
| 8,093,979 B2 | 1/2012 | Wilson |
| 8,115,343 B2 | 2/2012 | Sanders et al. |
| 8,120,207 B2 | 2/2012 | Sanders et al. |
| 8,129,653 B2 | 3/2012 | Kirchmeier et al. |
| 8,143,790 B2 | 3/2012 | Smith et al. |
| 8,222,936 B2 | 7/2012 | Friedman et al. |
| 8,259,476 B2 | 9/2012 | Ben-Yaakov et al. |
| 8,410,889 B2 | 4/2013 | Garrity et al. |
| 8,436,602 B2 | 5/2013 | Sykes |
| 8,450,985 B2 | 5/2013 | Gray et al. |
| 8,471,642 B2 | 6/2013 | Hill |
| 8,575,843 B2 | 11/2013 | Moore et al. |
| 8,723,591 B2 | 5/2014 | Lee et al. |
| 8,773,184 B1 | 7/2014 | Petrov et al. |
| 8,828,254 B2 | 9/2014 | Inoue et al. |
| 8,847,433 B2 | 9/2014 | Vandermey |
| 8,963,377 B2 | 2/2015 | Ziemba et al. |
| 9,067,788 B1 | 6/2015 | Spielman et al. |
| 9,070,396 B1 | 6/2015 | Katchmart et al. |
| 9,084,334 B1 | 7/2015 | Gefter et al. |
| 9,122,350 B2 | 9/2015 | Kao et al. |
| 9,122,360 B2 | 9/2015 | Xu et al. |
| 9,155,590 B2 | 10/2015 | Mathur |
| 9,287,086 B2 | 3/2016 | Brouk et al. |
| 9,287,092 B2 | 3/2016 | Brouk et al. |
| 9,306,533 B1 | 4/2016 | Mavretic |
| 9,329,256 B2 | 5/2016 | Dolce |
| 9,349,603 B2 | 5/2016 | Inoue et al. |
| 9,417,739 B2 | 8/2016 | Cordeiro et al. |
| 9,435,029 B2 | 9/2016 | Brouk et al. |
| 9,493,765 B2 | 11/2016 | Krishnaswamy et al. |
| 9,515,633 B1 | 12/2016 | Long et al. |
| 9,601,283 B2 | 3/2017 | Ziemba et al. |
| 9,655,221 B2 | 5/2017 | Ziemba et al. |
| 9,706,630 B2 | 7/2017 | Miller et al. |
| 9,729,122 B2 | 8/2017 | Mavretic |
| 9,767,988 B2 | 9/2017 | Brouk et al. |
| 9,811,119 B2 | 11/2017 | Seo |
| 9,881,772 B2 | 1/2018 | Marakhatanov et al. |
| 9,960,763 B2 | 5/2018 | Miller et al. |
| 9,966,231 B2 | 5/2018 | Boswell et al. |
| 10,009,024 B2 | 6/2018 | Gan et al. |
| 10,020,800 B2 | 7/2018 | Prager et al. |
| 10,027,314 B2 | 7/2018 | Prager et al. |
| 10,044,278 B2 | 8/2018 | Kondo et al. |
| 10,217,608 B2 | 2/2019 | Mavretic |
| 10,224,822 B2 | 3/2019 | Miller et al. |
| 10,301,587 B2 | 5/2019 | Krishnaswamy et al. |
| 10,304,661 B2 | 5/2019 | Ziemba et al. |
| 10,373,755 B2 | 8/2019 | Prager et al. |
| 10,373,804 B2 | 8/2019 | Koh et al. |
| 10,381,949 B2 | 8/2019 | Hamerski et al. |
| 10,382,022 B2 | 8/2019 | Prager et al. |
| 10,448,494 B1 | 10/2019 | Dorf et al. |
| 10,448,495 B1 | 10/2019 | Dorf et al. |
| 10,460,910 B2 | 10/2019 | Ziemba et al. |
| 10,460,911 B2 | 10/2019 | Ziemba et al. |
| 10,483,089 B2 | 11/2019 | Ziemba et al. |
| 10,483,090 B2 | 11/2019 | Bhutta |
| 10,510,575 B2 | 12/2019 | Kraus et al. |
| 10,555,412 B2 | 2/2020 | Dorf et al. |
| 10,600,619 B2 | 3/2020 | Inoue et al. |
| 10,607,814 B2 | 3/2020 | Ziemba et al. |
| 10,631,395 B2 | 4/2020 | Sanders et al. |
| 10,659,019 B2 | 5/2020 | Slobodov et al. |
| 10,707,864 B2 | 7/2020 | Miller et al. |
| 10,734,906 B2 | 8/2020 | Miller et al. |
| 10,777,388 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,230 B2 | 10/2020 | Ziemba et al. |
| 10,876,241 B2 | 12/2020 | Hu et al. |
| 10,892,140 B2 | 1/2021 | Ziemba et al. |
| 10,892,141 B2 | 1/2021 | Ziemba et al. |
| 10,896,809 B2 | 1/2021 | Ziemba et al. |
| 10,903,047 B2 | 1/2021 | Ziemba et al. |
| 10,916,408 B2 | 2/2021 | Dorf et al. |
| 10,978,955 B2 | 4/2021 | Ziemba et al. |
| 10,978,995 B2 | 4/2021 | Itasaka et al. |
| 10,985,740 B2 | 4/2021 | Prager et al. |
| 10,991,553 B2 | 4/2021 | Ziemba et al. |
| 11,004,660 B2 | 5/2021 | Prager et al. |
| 11,101,108 B2 | 8/2021 | Slobodov et al. |

(56) References Cited

U.S. PATENT DOCUMENTS

| | | |
|---|---|---|
| 11,171,568 B2 | 11/2021 | Miller et al. |
| 11,222,767 B2 | 1/2022 | Ziemba et al. |
| 11,284,500 B2 | 3/2022 | Dorf et al. |
| 11,350,495 B2 | 5/2022 | Chen et al. |
| 11,404,246 B2 | 8/2022 | Ziemba et al. |
| 11,404,247 B2 | 8/2022 | Bowman et al. |
| 11,476,145 B2 | 10/2022 | Rogers et al. |
| 11,689,107 B2 | 6/2023 | Ziemba et al. |
| 11,690,671 B1 | 7/2023 | Mickelsen |
| 11,725,138 B2 | 8/2023 | Kim et al. |
| 11,810,761 B2 | 11/2023 | Slobodov et al. |
| 11,824,542 B1 | 11/2023 | Henson et al. |
| 11,883,666 B2 | 1/2024 | Swoyer |
| 2001/0008552 A1 | 7/2001 | Harada et al. |
| 2001/0033500 A1 | 10/2001 | Hummert et al. |
| 2002/0016617 A1 | 2/2002 | Oldham |
| 2002/0140464 A1 | 10/2002 | Yampolsky et al. |
| 2002/0180276 A1 | 12/2002 | Sakuma et al. |
| 2002/0186577 A1 | 12/2002 | Kirbie |
| 2003/0021125 A1 | 1/2003 | Rufer et al. |
| 2003/0021131 A1 | 1/2003 | Nadot et al. |
| 2003/0054647 A1 | 3/2003 | Suemasa et al. |
| 2003/0071035 A1 | 4/2003 | Brailove |
| 2003/0137791 A1 | 7/2003 | Arnet et al. |
| 2003/0169107 A1 | 9/2003 | LeChevalier |
| 2003/0227280 A1 | 12/2003 | Vinciarelli |
| 2004/0085784 A1 | 5/2004 | Salama et al. |
| 2004/0149217 A1 | 8/2004 | Collins et al. |
| 2004/0263412 A1 | 12/2004 | Pribyl |
| 2004/0264521 A1 | 12/2004 | Ness et al. |
| 2005/0152159 A1 | 7/2005 | Isurin et al. |
| 2005/0184669 A1 | 8/2005 | Chistyakov |
| 2005/0270096 A1 | 12/2005 | Coleman |
| 2006/0018074 A1 | 1/2006 | Inoue et al. |
| 2006/0048894 A1 | 3/2006 | Yamazaki et al. |
| 2006/0187607 A1 | 8/2006 | Mo |
| 2006/0192774 A1 | 8/2006 | Yasumura |
| 2006/0210020 A1 | 9/2006 | Takahashi et al. |
| 2006/0274887 A1 | 12/2006 | Sakamoto et al. |
| 2007/0018504 A1 | 1/2007 | Wiener et al. |
| 2007/0114981 A1 | 5/2007 | Vasquez et al. |
| 2007/0115705 A1 | 5/2007 | Gotzenberger et al. |
| 2007/0212811 A1 | 9/2007 | Hanawa et al. |
| 2007/0235412 A1 | 10/2007 | Fischer |
| 2008/0062733 A1 | 3/2008 | Gay |
| 2008/0106151 A1 | 5/2008 | Ryoo et al. |
| 2008/0143260 A1 | 6/2008 | Tuymer et al. |
| 2008/0198634 A1 | 8/2008 | Scheel et al. |
| 2008/0231337 A1 | 9/2008 | Krishnaswamy et al. |
| 2008/0252225 A1 | 10/2008 | Kurachi et al. |
| 2008/0272706 A1 | 11/2008 | Kwon et al. |
| 2009/0016549 A1 | 1/2009 | French et al. |
| 2009/0108759 A1 | 4/2009 | Tao et al. |
| 2009/0255800 A1 | 10/2009 | Koshimizu |
| 2009/0322307 A1 | 12/2009 | Ide |
| 2010/0007358 A1 | 1/2010 | Schaerrer et al. |
| 2010/0141224 A1 | 6/2010 | Ilic et al. |
| 2010/0148847 A1 | 6/2010 | Schurack et al. |
| 2010/0284208 A1 | 11/2010 | Nguyen et al. |
| 2011/0001438 A1 | 1/2011 | Chemel et al. |
| 2011/0133651 A1 | 6/2011 | Chistyakov et al. |
| 2011/0140607 A1 | 6/2011 | Moore et al. |
| 2011/0190755 A1 | 8/2011 | Mathur et al. |
| 2011/0309748 A1 | 12/2011 | Xia |
| 2012/0016282 A1 | 1/2012 | Van Brunt et al. |
| 2012/0052599 A1 | 3/2012 | Brouk et al. |
| 2012/0081350 A1 | 4/2012 | Sano et al. |
| 2012/0155613 A1 | 6/2012 | Caiafa et al. |
| 2012/0228263 A1 | 9/2012 | Ul et al. |
| 2013/0024784 A1 | 1/2013 | Lifton |
| 2013/0027848 A1 | 1/2013 | Said |
| 2013/0029492 A1 | 1/2013 | Inoue et al. |
| 2013/0059448 A1 | 3/2013 | Marakhtanov et al. |
| 2013/0075390 A1 | 3/2013 | Ashida |
| 2013/0092529 A1 | 4/2013 | Singh et al. |
| 2013/0113650 A1 | 5/2013 | Behbahani et al. |
| 2013/0138097 A1 | 5/2013 | Mathur et al. |
| 2013/0146443 A1 | 6/2013 | Papa et al. |
| 2013/0174105 A1 | 7/2013 | Nishio et al. |
| 2013/0175573 A1 | 7/2013 | Mayer et al. |
| 2013/0175575 A1 | 7/2013 | Ziemba et al. |
| 2013/0213935 A1 | 8/2013 | Liao et al. |
| 2013/0320953 A1 | 12/2013 | Cassel et al. |
| 2014/0009969 A1 | 1/2014 | Yuzurihara et al. |
| 2014/0021180 A1 | 1/2014 | Vogel |
| 2014/0077611 A1 | 3/2014 | Young et al. |
| 2014/0109886 A1 | 4/2014 | Singleton et al. |
| 2014/0118414 A1 | 5/2014 | Seo et al. |
| 2014/0146571 A1 | 5/2014 | Ryoo et al. |
| 2014/0268968 A1 | 9/2014 | Richardson |
| 2014/0349418 A1 | 11/2014 | Inoue et al. |
| 2014/0354343 A1 | 12/2014 | Ziemba et al. |
| 2015/0028932 A1 | 1/2015 | Ziemba et al. |
| 2015/0076372 A1 | 3/2015 | Ziemba et al. |
| 2015/0084509 A1 | 3/2015 | Yuzurihara et al. |
| 2015/0130525 A1 | 5/2015 | Miller et al. |
| 2015/0155086 A1 | 6/2015 | Matsuura |
| 2015/0184284 A1 | 7/2015 | Elghazzali et al. |
| 2015/0206716 A1 | 7/2015 | Kim et al. |
| 2015/0256086 A1 | 9/2015 | Miller et al. |
| 2015/0303914 A1 | 10/2015 | Ziemba et al. |
| 2015/0311680 A1 | 10/2015 | Burrows et al. |
| 2015/0318846 A1 | 11/2015 | Prager et al. |
| 2016/0020070 A1 | 1/2016 | Kim et al. |
| 2016/0020072 A1 | 1/2016 | Brouk et al. |
| 2016/0020672 A1 | 1/2016 | Shuck et al. |
| 2016/0182001 A1 | 6/2016 | Zeng et al. |
| 2016/0211153 A1 | 7/2016 | Terauchi et al. |
| 2016/0220670 A1 | 8/2016 | Kalghatgi et al. |
| 2016/0225587 A1 | 8/2016 | Inoue et al. |
| 2016/0241234 A1 | 8/2016 | Mavretic |
| 2016/0269195 A1 | 9/2016 | Coenen et al. |
| 2016/0327029 A1 | 11/2016 | Ziemba et al. |
| 2016/0327089 A1 | 11/2016 | Adam et al. |
| 2016/0358755 A1 | 12/2016 | Long et al. |
| 2017/0083810 A1 | 3/2017 | Ielmini et al. |
| 2017/0104469 A1 | 4/2017 | Mavretic |
| 2017/0125517 A1 | 5/2017 | Tapily et al. |
| 2017/0126049 A1 | 5/2017 | Pan et al. |
| 2017/0154726 A1 | 6/2017 | Prager et al. |
| 2017/0243731 A1 | 8/2017 | Ziemba et al. |
| 2017/0294842 A1 | 10/2017 | Miller et al. |
| 2017/0311431 A1 | 10/2017 | Park |
| 2017/0314133 A1 | 11/2017 | Kim et al. |
| 2017/0330729 A1 | 11/2017 | Mavretic |
| 2017/0359886 A1 | 12/2017 | Binderbauer et al. |
| 2017/0366173 A1 | 12/2017 | Miller et al. |
| 2018/0041183 A1 | 2/2018 | Mavretic et al. |
| 2018/0226896 A1 | 8/2018 | Miller et al. |
| 2018/0286636 A1 | 10/2018 | Ziemba et al. |
| 2018/0315581 A1 | 11/2018 | Hayami et al. |
| 2018/0315583 A1 | 11/2018 | Luere et al. |
| 2018/0323576 A1 | 11/2018 | Crawford et al. |
| 2018/0374689 A1 | 12/2018 | Abraham et al. |
| 2019/0074806 A1 | 3/2019 | Scott et al. |
| 2019/0080884 A1 | 3/2019 | Ziemba et al. |
| 2019/0088518 A1 | 3/2019 | Koh et al. |
| 2019/0131110 A1 | 5/2019 | Ziemba et al. |
| 2019/0157044 A1 | 5/2019 | Ziemba et al. |
| 2019/0157980 A1 | 5/2019 | Ji et al. |
| 2019/0172683 A1 | 6/2019 | Mavretic et al. |
| 2019/0172685 A1 | 6/2019 | Van Zyl et al. |
| 2019/0180982 A1 | 6/2019 | Brouk et al. |
| 2019/0228952 A1 | 7/2019 | Dorf et al. |
| 2019/0236426 A1 | 8/2019 | Zhang et al. |
| 2019/0267212 A1 | 8/2019 | Mavretic |
| 2019/0295821 A1 | 9/2019 | Shoeb et al. |
| 2019/0326092 A1 | 10/2019 | Ogasawara et al. |
| 2019/0348258 A1 | 11/2019 | Koh et al. |
| 2019/0350072 A1 | 11/2019 | Dorf et al. |
| 2019/0393791 A1 | 12/2019 | Ziemba et al. |
| 2020/0035457 A1 | 1/2020 | Ziemba et al. |
| 2020/0035458 A1 | 1/2020 | Ziemba et al. |
| 2020/0036367 A1 | 1/2020 | Slobodov et al. |

(56) References Cited

U.S. PATENT DOCUMENTS

| | | |
|---|---|---|
| 2020/0037468 A1 | 1/2020 | Ziemba et al. |
| 2020/0043702 A1 | 2/2020 | Ziemba et al. |
| 2020/0051786 A1 | 2/2020 | Ziemba et al. |
| 2020/0126760 A1 | 4/2020 | Ziemba et al. |
| 2020/0144030 A1 | 5/2020 | Prager et al. |
| 2020/0154556 A1 | 5/2020 | Dorf et al. |
| 2020/0161092 A1 | 5/2020 | Inoue et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0219702 A1 | 7/2020 | Prager et al. |
| 2020/0227230 A1 | 7/2020 | Ziemba et al. |
| 2020/0244254 A1 | 7/2020 | Slobodov et al. |
| 2020/0352017 A1 | 11/2020 | Dorf et al. |
| 2020/0378605 A1 | 12/2020 | Lacoste |
| 2020/0396820 A1 | 12/2020 | de Vries et al. |
| 2021/0013011 A1 | 1/2021 | Prager et al. |
| 2021/0091759 A1 | 3/2021 | Prager et al. |
| 2021/0152163 A1 | 5/2021 | Miller et al. |
| 2021/0288582 A1 | 9/2021 | Ziemba et al. |
| 2022/0013329 A1 | 1/2022 | Bowman et al. |
| 2024/0088877 A1 | 3/2024 | Henson et al. |
| 2024/0138908 A1 | 5/2024 | Stewart et al. |

FOREIGN PATENT DOCUMENTS

| | | |
|---|---|---|
| CN | 103890897 A | 6/2014 |
| CN | 103458600 B | 7/2016 |
| CN | 106537776 A | 3/2017 |
| CN | 210056212 U | 2/2020 |
| CN | 112511136 A | 3/2021 |
| CN | 113179029 A | 7/2021 |
| CN | 113630107 A | 11/2021 |
| CN | 114649972 A | 6/2022 |
| CN | 115065342 A | 9/2022 |
| CN | 115395926 A | 11/2022 |
| EP | 0174164 A2 | 3/1986 |
| EP | 0840350 A2 | 5/1998 |
| EP | 0947048 A1 | 10/1999 |
| EP | 1128557 A2 | 8/2001 |
| EP | 1515430 A1 | 3/2005 |
| EP | 3167549 B1 | 3/2019 |
| FR | 2771563 A1 | 5/1999 |
| JP | H09120956 A | 5/1997 |
| JP | H09129621 A | 5/1997 |
| JP | H10223952 A | 8/1998 |
| JP | H11164552 A | 6/1999 |
| JP | H11172436 A | 6/1999 |
| JP | 2000268996 A | 9/2000 |
| JP | 2000306891 A | 11/2000 |
| JP | 2001181830 A | 7/2001 |
| JP | 2002222801 A | 8/2002 |
| JP | 2002324698 A | 11/2002 |
| JP | 2002359979 A | 12/2002 |
| JP | 2004101788 A | 4/2004 |
| JP | 2004340036 A | 12/2004 |
| JP | 2007203088 A | 8/2007 |
| JP | 2009263778 A | 11/2009 |
| JP | 2012065547 A | 3/2012 |
| JP | 2013135159 A | 7/2013 |
| JP | 5770628 B2 | 8/2015 |
| JP | 2015531025 A | 10/2015 |
| JP | 2015220929 A | 12/2015 |
| JP | 5852380 B2 | 2/2016 |
| JP | 2016134461 A | 7/2016 |
| JP | 2016181343 A | 10/2016 |
| JP | 2017501298 A | 1/2017 |
| JP | 2017504955 A | 2/2017 |
| JP | 6310601 B1 | 4/2018 |
| JP | 2019197890 A | 11/2019 |
| JP | 2020501351 A | 1/2020 |
| JP | 2020529180 A | 10/2020 |
| KR | 20200036947 A | 4/2020 |
| TW | 200739723 A | 10/2007 |
| TW | I380151 B | 12/2012 |
| TW | I474601 B | 2/2015 |
| TW | 201515525 A | 4/2015 |
| TW | I564928 B | 1/2017 |
| WO | 9738479 A1 | 10/1997 |
| WO | 9960679 A1 | 11/1999 |
| WO | 0193419 A1 | 12/2001 |
| WO | 2010069317 A1 | 6/2010 |
| WO | 2014036000 A1 | 3/2014 |
| WO | 2016171582 A1 | 10/2016 |
| WO | 2017126662 A1 | 7/2017 |
| WO | 2018008310 A1 | 1/2018 |
| WO | 2018034771 A1 | 2/2018 |
| WO | 2018186901 A1 | 10/2018 |
| WO | 2019040949 A1 | 2/2019 |
| WO | 2020146436 A1 | 7/2020 |
| WO | 2020160497 A1 | 8/2020 |
| WO | 2021003319 A1 | 1/2021 |

OTHER PUBLICATIONS

Dammertz, G., et al., "Development of Multimegawatt Gyrotrons for Fusion Plasma Heating and current Drive," IEEE Transactions on Electron Devices, vol. 52, No. 5, pp. 808-817 (Apr. 2005) (Abstract).

Garwin, R., "Pulsed Power Peer Review Committee Report," Sandia National Laboratories Report, SAND2000-2515, pp. 3-38 (Oct. 2000).

Gaudet, J.A., et al., "Research issues in Developing Compact Pulsed Power for High Peak Power Applications on Mobile Platforms," Proceedings of the IEEE, vol. 92, No. 7, pp. 1144-1165 (Jul. 2004).

Goodman, E. A., "Characteristics of sheet windings in transformers", IEEE Engineering, vol. 82, No. 11, pp. 673-676 (Nov. 1963) (Abstract).

In, Y., et al., "On the roles of direct feedback and error field correction in stabilizing resistive-wall modes," Nuclear 2 Fusion, vol. 50, No. 4, pp. 1-5 (2010).

Kim, J.H., et al., "High Voltage Pulsed Power Supply Using IGBT Stacks," IEEE Transactions on Dielectrics and Electrical insulation, vol. 14, No. 4, pp. 921-926 (Aug. 2007).

Locher, R., "Introduction to Power MOSFETs and their Applications (Application Note 558)," Fairchild Semiconductor, 15 pages (Oct. 1998).

Locher, R.E., and Pathak, A.D., "Use of BiMOSFETs in Modern Radar Transmitters," IEEE International Conference on Power Electronics and Drive Systems, pp. 776-782 (2001).

Pokryvailo, A., et al., "A 1KW Pulsed Corona System for Pollution Control Applications," 14th IEEE International Pulsed Power Conference, Dallas, TX, USA (Jun. 15-18, 2003).

Pokryvailo, A., et al., "High-Power Pulsed Corona for Treatment of Pollutants in Heterogeneous Media," IEEE Transactions on Plasma Science, vol. 34, No. 5, pp. 1731-1743 (Oct. 2006) (Abstract).

Prager, J.R. et al., "A High Voltage Nanosecond Pulser with Variable Pulse Width and Pulse Repetition Frequency control For Nonequilibrium Plasma Applications", 41st International Conference on Plasma Sciences held with 2014 IEEE International Conference on High-Power Particle Beams, May 25-29, 2014, 6, Washington, D.C.

Pustylnik, M., et al., "High-voltage nanosecond pulses in a low-pressure radiofrequency discharge", Physical Review E, vol. 87, No. 6, pp. 1-9 (2013).

Quinley, M., et al., "High Voltage Nanosecond Pulser Operating at 30 kW and 400 kHz" APS-GEC-2018, 1 page (2018).

Rao, X., et al., "Combustion Dynamics of Plasma-Enhanced Premixed and Nonpremixed Flames," IEEE Transactions on Plasma Science, vol. 38, No. 12, pp. 3265-3271 (Dec. 2010).

Reass, W.A., et al., "Progress Towards a 20 KV, 2 KA Plasma Source Ion Implantation Modulator for Automotive Production of Diamond Film on Aluminum," Submitted to 22nd International Power Symposium, Boca Raton, FL, 6 pages (Jun. 24-27, 1996).

Sanders, J.M., et al., "Scalable, compact, nanosecond pulse generator with a high repetition rate for biomedical applications requiring intense electric fields," 2009 IEEE Pulsed Power Conference, Washington, DC, 2 pages (Jun. 28, 2009-Jul. 2, 2009) (Abstract).

(56) References Cited

OTHER PUBLICATIONS

Schamiloglu, E., et al., "Scanning the Technology: Modem Pulsed Power: Charlie Martin and Beyond," Proceedings of the IEEE, vol. 92, No. 7, pp. 1014-1020 (Jul. 2004).
Scoville, J.T., et al., "The Resistive Wall Mode Feedback Control System on DIII-D," IEEE/NPSS 18th Symposium on fusion Engineering, Albuquerque, NM, Oct. 25-29, 1999, General Atomics Report GAA23256, 7 pages (Nov. 1999).
Singleton, D.R., et al., "Compact Pulsed-Power System for Transient Plasma Ignition," IEEE Transactions on Plasma Science, vol. 37, No. 12, pp. 2275-2279 (2009) (Abstract).
Singleton, D.R., et al., "Low Energy Compact Power Modulators for Transient Plasma Ignition," IEEE Transactions on Dielectrics and Electrical Insulation, vol. 18, No. 4, pp. 1084-1090 (Aug. 2011) (Abstract).
Starikovskiy, A., and Aleksandrov, N., "Plasma-assisted ignition and combustion," Progress in Energy and Combustion Science, vol. 39, No. 1, pp. 61-110 (Feb. 2013).
Wang, F., et al., "Compact High Repetition Rate Pseudospark Pulse Generator," IEEE Transactions on Plasma Science, vol. 33, No. 4, pp. 1177-1181 (Aug. 2005) (Abstract).
Zavadtsev, D.A., et al., "Compact Electron Linear Accelerator RELUS-5 for Radiation Technology Application," 10th European Particle Accelerator Conference, Edinburgh, UK, pp. 2385-2387 (Jun. 26-30, 2006).
Zhu, Z., et al., "High Voltage pulser with a fast fall-time for plasma immersion ion implantation," Review of Scientific Instruments, vol. 82, No. 4, pp. 045102-1-045102-4 (Apr. 2011).
International Search Report and Written Opinion as issued in connection with International Patent Application No. PCT/US2014/040929, mailed Sep. 15, 2014, 10 pages.
International Search Report and Written Opinion as issued in connection with International Patent Application No. PCT/US2014/065832, mailed Feb. 20, 2015, 13 pages.
Invitation to pay additional fees in PCT Application No. PCT/US2015/018349 mailed on May 15, 2015, 2 pages.
International Search Report and Written Opinion as issued in connection with International Patent Application No. PCT/US2015/018349, mailed Jul. 14, 2015, 15 pages.
International Search Report and Written Opinion as issued in connection with International Patent Application No. PCT/US2015/040204, mailed Oct. 6, 2015, 12 pages.
Non-Final Office Action in U.S. Appl. No. 14/542,487 dated Nov. 23, 2015, 11 pages.
Non-Final Office Action in U.S. Appl. No. 14/798,154 dated Jan. 5, 2016, 13 pages.
Final Office Action in U.S. Appl. No. 14/542,487 dated Feb. 12, 2016, 11 pages.
Non-Final Office Action in U.S. Appl. No. 14/542,487 dated Apr. 8, 2016, 12 pages.
International Preliminary Report on Patentability in PCT Application No. PCT/US2014/065832 mailed on May 17, 2016, 7 pages.
Non Final Office Action in U.S. Appl. No. 14/635,991, dated Jul. 29, 2016, 17 pages.
International Preliminary Report on Patentability in PCT Application No. PCT/US2015/018349 mailed on Sep. 6, 2016, 8 pages.
Final Office Action in U.S. Appl. No. 14/798,154 dated Oct. 6, 2016, 14 pages.
Final Office Action in U.S. Appl. No. 14/542,487 dated Dec. 12, 2016, 13 pages.
International Preliminary Report on Patentability in PCT Application No. PCT/US2015/040204 mailed on Jan. 17, 2017, 7 pages.
Final Office Action in U.S. Appl. No. 14/635,991, dated Jan. 23, 2017, 22 pages.
Advisory Action in U.S. Appl. No. 14/542,487 dated Mar. 28, 2017, 03 pages.
Notice of Allowance in U.S. Appl. No. 14/635,991, dated May 4, 2017, 07 pages.
Non-Final Office Action in U.S. Appl. No. 14/798,154 dated May 26, 2017, 16 pages.
Non-Final Office Action in U.S. Appl. No. 14/542,487 dated Jun. 5, 2017, 12 pages.
Partial Supplementary European Search Report in related foreign application No. 14861818.4, 12 Pages.
Non Final Office Action in U.S. Appl. No. 15/623,464, dated Nov. 7, 2017, 18 pages.
Final Office Action in U.S. Appl. No. 14/542,487 dated Dec. 19, 2017, 07 pages.
Final Office Action in U.S. Appl. No. 14/798,154 dated Dec. 28, 2017, 06 pages.
Notice of Allowance in U.S. Appl. No. 14/542,487 dated Mar. 21, 2018, 05 pages.
Restriction Requirement in U.S. Appl. No. 17/133,612, dated Aug. 26, 2021, 5 pages.
Non-Final Office Action in U.S. Appl. No. 17/223,004, dated Aug. 31, 2021, 12 pages.
Invitation to Pay Additional Fees as issued in connection with International Patent Application No. PCT/US2021/41180, mailed Sep. 21, 2021, 2 pages.
Non-Final Office Action in U.S. Appl. No. 17/033,662 dated Sep. 1, 2021, 17 pages.
Notice of Allowance in U.S. Appl. No. 16/722,115 dated Oct. 4, 2021, 9 pages.
Notice of Allowance in U.S. Appl. No. 16/537,513, dated Oct. 8, 2021, 10 pages.
Notice of Allowance in U.S. Appl. No. 16/737,615 dated Nov. 24, 2021, 11 pages.
International Search Report and Written Opinion as issued in connection with International Patent Application No. PCT/US2021/41180, mailed Dec. 7, 2021, 11 pages.
Final Office Action in U.S. Appl. No. 17/033,662 dated Dec. 8, 2021, 17 pages.
Non-Final Office Action in U.S. Appl. No. 17/213,230 dated Dec. 14, 2021, 6 pages.
English translation of Office Action for Taiwan application No. 109100609 mailed Dec. 16, 2021, 5 pages.
Invitation to Pay Additional Fees in PCT Application No. PCT/US2021/053436 mailed on Dec. 2, 2021, 2 pages.
Restriction Requirement in U.S. Appl. No. 17/099,729 dated on Jan. 20, 2022, 7 pages.
Notification of Reason for Refusal in JP Patent application No. 2021-101259 dated Feb. 1, 2022, 21 pages.
International Search Report and Written Opinion in PCT Application No. PCT/US2021/053436 mailed on Feb. 8, 2022, 13 pages.
Notice of Reason for Refusal for JP Patent Application No. 2021-504453, mailed on Mar. 1, 2022, 12 pages.
Non-Final Office Action in U.S. Appl. No. 17/163,331 dated Mar. 4, 2022, 23 pages.
Non Final Office Action in U.S. Appl. No. 17/142,069 dated Mar. 7, 2022, 7 pages.
Notice of Allowance in U.S. Appl. No. 16/941,532, dated Apr. 5, 2022, 9 pages.
Notice of Allowance in U.S. Appl. No. 17/099,729 dated Apr. 21, 2022 10 pages.
Notice of Allowance in U.S. Appl. No. 17/372,398 dated Apr. 27, 2022, 9 pages.
Final Office Action in U.S. Appl. No. 17/223,004 dated May 11, 2022, 9 pages.
Final Office Action in U.S. Appl. No. 17/213,230 dated May 16, 2022, 16 pages.
International Preliminary Report in Patentability PCT Application No. PCT/US2020/60799, dated May 17, 2022, 09 pages.
Non Final Office Action in U.S. Appl. No. 17/231,923, dated Jun. 6, 2022, 6 pages.
Non-Final Office Action in U.S. Appl. No. 17/499,863 dated Jun. 7, 2022, 15 pages.
Non-Final Office Action in U.S. Appl. No. 17/359,498, dated Jun. 29, 2022, 7 pages.
Decision of Refusal for JP Patent Application No. 2021-504453, mailed on Jul. 21, 2022, 11 pages.
Notice of Allowance in U.S. Appl. No. 17/223,004 dated Jul. 25, 2022, 8 pages.

(56) References Cited

OTHER PUBLICATIONS

Advisory Action in U.S. Appl. No. 17/213,230 dated Aug. 5, 2022, 3 pages.
Final Office Action in U.S. Appl. No. 17/142,069 dated Aug. 18, 2022, 06 pages.
Non-Final Office Action in U.S. Appl. No. 17/213,230 dated Sep. 15, 2022, 9 pages.
Notice of Allowance in U.S. Appl. No. 17/359,498, dated Oct. 12, 2022, 09 pages.
Notice of Allowance in U.S. Appl. No. 17/499,863 dated Oct. 19, 2022, 7 pages.
Notice of Allowance in U.S. Appl. No. 17/231,923, dated Nov. 16, 2022, 9 pages.
Non Final Office Action in U.S. Appl. No. 17/851,022 dated on Nov. 25, 2022, 8 pages.
Notice of Allowance in U.S. Appl. No. 17/098,207 dated Jan. 5, 2023, 15 pages.
Notice of Allowance in U.S. Appl. No. 17/033,662, dated Feb. 7, 2023, 9 pages.
Notice of Allowance in U.S. Appl. No. 17/834,933 mailed on Feb. 16, 2023, 9 pages.
Non-Final Office Action in U.S. Appl. No. 17/411,028 dated Feb. 24, 2023, 6 pages.
Notice of Allowance in U.S. Appl. No. 17/213,230 dated Mar. 8, 2023, 7 pages.
Notice of Allowance in U.S. Appl. No. 17/851,022 dated Mar. 20, 2023, 10 pages.
Non Final Office Action in U.S. Appl. No. 17/853,891 dated on May 2, 2023, 9 pages.
Final Office Action in U.S. Appl. No. 17/411,028 dated Jun. 22, 2023, 9 pages.
Notice of Reason for Refusal for JP Patent Application No. 2022-034989, mailed on Jul. 11, 2023, 6 pages.
Notice of Allowance in U.S. Appl. No. 17/853,891 dated Aug. 15, 2023, 7 pages.
Notice of Allowance in U.S. Appl. No. 17/411,028 dated Aug. 30, 2023, 9 pages.
International Preliminary Report in Patentability PCT Application No. PCT/US2021/41180, dated Jan. 10, 2023, 08 pages.
Notice of Allowance in U.S. Appl. No. 17/142,069 dated Jan. 11, 2023, 10 pages.
Non-Final Office Action in U.S. Appl. No. 18/340,841 dated Jan. 24, 2023, 18 pages.
Notice of Reason for Refusal for JP Patent Application No. 2023-520043, mailed on Apr. 2, 2024, 8 pages.
Office Action in KR Patent application No. 2023-7028274 dated Apr. 19, 2024, 4 pages.
Office Action in KR Patent application No. 2023-7029360 dated Apr. 19, 2024, 10 pages.
Non-Final Office Action in U.S. Appl. No. 18/493,515 dated May 6, 2024, 8 pages.
Extended European Search Report in EP Application No. 21838456.8, mailed on Jul. 3, 2024, 9 pages.
Office Action in KR Patent application No. 2023-7015060 dated Jul. 25, 2024, 14 pages.
Extended European Search Report for Application No. 23158873.2, 9 pages.
Restriction Requirement in U.S. Appl. No. 17/493,835 dated Jul. 6, 2023, 7 pages.
International Search Report and Written Opinion as issued in connection with International Patent Application No. PCT/US2023/069316, mailed Sep. 5, 2023, 08 pages.
Extended European Search Report for Application No. 20887869.4, 8 pages.
Non Final Office Action in U.S. Appl. No. 17/493,835 dated on Sep. 21, 2023, 9 pages.
Notice of Reason for Refusal for JP Patent Application No. 2021-504453, mailed on Jan. 9, 2024, 5 pages.
Notice of Allowance in U.S. Appl. No. 17/493,835 dated Jan. 18, 2024, 9 pages.
Non-Final Office Action in U.S. Appl. No. 16/555,948, dated May 15, 2020, 8 pages.
International Search Report and Written Opinion as issued in connection with International Patent Application No. PCT/US2020/012641, mailed May 28, 2020, 15 pages.
Extended European Search Report for Application No. 18848041.2, 9 pages.
Non Final Office Action in U.S. Appl. No. 16/697,173, dated Jun. 26, 2020, 19 pages.
Final Office Action in U.S. Appl. No. 16/523,840, dated Jun. 26, 2020, 5 pages.
Notice of Allowance in U.S. Appl. No. 16/736,971, dated Jun. 30, 2020, 14 pages.
Advisory Action in U.S. Appl. No. 15/889,586 dated Jul. 10, 2020, 4 pages.
Notice of Allowance in U.S. Appl. No. 16/722,085, dated Jul. 16, 2020, 8 pages.
Non Final Office Action in U.S. Appl. No. 16/779,270, dated Jul. 16, 2020, 9 pages.
Notice of Allowance in U.S. Appl. No. 16/524,967, dated Jul. 17, 2020, 11 pages.
Final Office Action in U.S. Appl. No. 16/599,318, dated Jul. 23, 2020, 14 pages.
Notice of Allowance in U.S. Appl. No. 16/599,318, dated Aug. 4, 2020, 8 pages.
Notice of Allowance in U.S. Appl. No. 16/779,270, dated Aug. 10, 2020, 6 pages.
Non Final Office Action in U.S. Appl. No. 16/537,513, dated Sep. 3, 2020, 13 pages.
Non-Final Office Action in U.S. Appl. No. 15/889,586 dated Sep. 18, 2020, 19 pages.
International Search Report and Written Opinion as issued in connection with International Patent Application No. PCT/US2020/040579, mailed Sep. 30, 2020, 10 pages.
Notice of Allowance in U.S. Appl. No. 16/523,840, dated Sep. 30, 2020, 11 pages.
Notice of Allowance in U.S. Appl. No. 16/779,270, dated Oct. 8, 2020, 5 pages.
International Search Report and Written Opinion as issued in connection with International Patent Application No. PCT/US2020/034427, mailed Oct. 16, 2020, 9 pages.
Notice of Allowance in U.S. Appl. No. 16/524,950, dated Oct. 19, 2020, 9 pages.
Notice of Allowance in U.S. Appl. No. 16/524,950, dated Nov. 16, 2020, 9 pages.
Non Final Office Action in U.S. Appl. No. 16/903,374, dated Nov. 25, 2020, 16 pages.
Final Office Action in US Application No. 16/722, 115, dated Dec. 2, 2020, 7 pages.
Notice of Allowance in U.S. Appl. No. 16/523,840, dated Dec. 4, 2020, 11 pages.
Final Office Action in U.S. Appl. No. 16/537,513, dated Jan. 7, 2021, 12 pages.
Notice of Allowance in U.S. Appl. No. 16/555,948, dated Jan. 13, 2021, 7 pages.
Notice of Allowance in U.S. Appl. No. 16/524,926, dated Jan. 15, 2021, 9 pages.
Notice of Allowance in U.S. Appl. No. 16/457,791 dated Jan. 22, 2021, 7 pages.
International Search Report and written opinion received for PCT Patent Application No. PCT/US2020/60799, mailed in Feb. 5, 2021, 11 pages.
Notice of Allowance in U.S. Appl. No. 16/697,173, dated Feb. 9, 2021, 13 pages.
International Preliminary Report on Patentability in PCT Application No. PCT/US2019/046067, dated Feb. 16, 2021, 09 Pages.
Notice of Allowance in U.S. Appl. No. 16/848,830, dated Feb. 19, 2021, 8 pages.
Extended European Search Report for Application No. 20195265.2, 8 pages.
Notice of Allowance in U.S. Appl. No. 16/722,115, dated Apr. 1, 2021, 9 pages.

(56) References Cited

OTHER PUBLICATIONS

Notice of Allowance in U.S. Appl. No. 15/889,586 dated Apr. 14, 2021, 9 pages.
Non Final Office Action in U.S. Appl. No. 16/941,532, dated Apr. 14, 2021, 10 pages.
Advisory Action in U.S. Appl. No. 16/537,513, dated Apr. 22, 2021, 5 pages.
Notice of Allowance in U.S. Appl. No. 16/721,396, dated Apr. 23, 2021, 10 pages.
Extended European Search Report for Application No. 20200919.7, 11 pages.
Non-Final Office Action in U.S. Appl. No. 16/722,115, dated May 3, 2021, 9 pages.
International Search Report and Written Opinion as issued in connection with International Patent Application No. PCT/US2020/066990, mailed May 5, 2021, 9 pages.
Notice of Allowance in U.S. Appl. No. 16/848,830, dated May 13, 2021, 6 pages.
Non-Final Office Action in U.S. Appl. No. 15/889,586 dated Jun. 11, 2021, 11 pages.
International Preliminary Report on Patentability in connection with International Patent Application No. PCT/US2020/012641, mailed Jun. 16, 2021, 11 pages.
Non-Final Office Action in U.S. Appl. No. 16/941,532 dated Jul. 16, 2021, 10 pages.
Notice of Allowance in U.S. Appl. No. 16/903,374, dated Jul. 19, 2021, 8 pages.
Notice of Reason for Refusal for JP Patent Application No. 2021-504454, mailed on Jul. 20, 2021, 8 pages.
Notice of Reason for Refusal for JP Patent Application No. 2021-504453, mailed on Jul. 20, 2021, 16 pages.
International Preliminary Report On Patentability dated Jul. 27, 2021 in PCT Application No. PCT/US2020/016253, 06 pages.
Non-Final Office Action in U.S. Appl. No. 16/937,948, dated Aug. 24, 2021, 10 pages.
Final Office Action in U.S. Appl. No. 15/623,464, dated Mar. 27, 2018, 18 pages.
International Search Report and Written Opinion as issued in connection with International Patent Application No. PCT/US2018/016993, mailed Apr. 18, 2018, 11 pages.
Non-Final Office Action in U.S. Appl. No. 15/889,586 dated Sep. 12, 2018, 18 pages.
Notice of Allowance in U.S. Appl. No. 14/798,154 dated Jun. 1, 2018, 05 pages.
International Search Report and Written Opinion as issued in connection with International Patent Application No. PCT/US2018/025440, mailed Jun. 25, 2018, 24 pages.
Notice of Allowance in U.S. Appl. No. 15/623,464, dated Oct. 17, 2018, 7 pages.
International Search Report and Written Opinion as issued in connection with International Patent Application No. PCT/US2018/048206, mailed Nov. 1, 2018, 10 pages.
Non Final Office Action in U.S. Appl. No. 15/941,731, dated Nov. 16, 2018, 17 pages.
Non-Final Office Action in U.S. Appl. No. 15/921,650 dated Nov. 28, 2018, 11 pages.
Non Final Office Action in U.S. Appl. No. 16/178,538, dated Jan. 11, 2019, 27 pages.
Non Final Office Action in U.S. Appl. No. 16/250,765, dated Mar. 29, 2019, 11 pages.
Notice of Allowance in U.S. Appl. No. 16/114,195, dated Apr. 3, 2019, 9 pages.
Notice of Allowance in U.S. Appl. No. 15/921,650 dated Apr. 4, 2019, 7 pages.
Non Final Office Action in U.S. Appl. No. 16/178,565, dated Apr. 4, 2019, 10 pages.
Final Office Action in U.S. Appl. No. 15/889,586 dated May 2, 2019, 19 pages.
Final Office Action in U.S. Appl. No. 15/941,731, dated May 3, 2019, 16 pages.
Final Office Action in U.S. Appl. No. 16/178,538 dated Jun. 7, 2019, 17 pages.
Notice of Allowance in U.S. Appl. No. 16/250,765, dated Jul. 10, 2019, 9 pages.
Final Office Action in U.S. Appl. No. 16/178,565, dated Jul. 12, 2019, 11 pages.
Notice of Allowance in U.S. Appl. No. 16/178,538 dated Jul. 17, 2019, 10 pages.
Notice of Allowance in U.S. Appl. No. 15/941,731, dated Jul. 17, 2019, 12 pages.
Non-Final Office Action in U.S. Appl. No. 15/889,586 dated Sep. 6, 2019, 17 pages.
Invitation to pay additional fees as issued in connection with International Patent Application No. PCT/US2019/043932, mailed Sep. 30, 2019, 2 pages.
International Preliminary Report on Patentability in connection with International Patent Application No. PCT/US2018/025440, mailed Oct. 1, 2019, 10 pages.
Invitation to pay additional fees as issued in connection with International Patent Application No. PCT/US2019/043988, mailed Oct. 10, 2019, 2 pages.
International Search Report and Written Opinion as issued in connection with International Patent Application No. PCT/US2019/043933, mailed Oct. 25, 2019, 9 pages.
Invitation to pay additional fees as issued in connection with International Patent Application No. PCT/US2019/046067, mailed Oct. 29, 2019, 2 pages.
Notice of Allowance in U.S. Appl. No. 16/178,565, dated Nov. 14, 2019, 5 pages.
Non Final Office Action in U.S. Appl. No. 15/945,722, dated Nov. 15, 2019, 13 pages.
International Search Report and Written Opinion as issued in connection with International Patent Application No. PCT/US2019/043932, mailed Dec. 5, 2019, 16 pages.
International Search Report and Written Opinion as issued in connection with International Patent Application No. PCT/US2019/043988, mailed Dec. 10, 2019, 13 pages.
Non Final Office Action in U.S. Appl. No. 16/250,157 dated Dec. 19, 2019, 6 pages.
International Search Report and Written Opinion as issued in connection with International Patent Application No. PCT/US2019/046067, mailed Jan. 3, 2020, 13 pages.
Notice of Allowance in U.S. Appl. No. 16/525,357, dated Jan. 14, 2020, 8 pages.
Non-Final Office Action in U.S. Appl. No. 16/599,318, dated Jan. 16, 2020, 11 pages.
Non-Final Office Action in U.S. Appl. No. 16/722,085, dated Mar. 6, 2020, 5 pages.
Final Office Action in U.S. Appl. No. 15/889,586 dated Mar. 18, 2020, 18 pages.
Non-Final Office Action in U.S. Appl. No. 16/523,840, dated Mar. 19, 2020, 6 pages.
Restriction Requirement in U.S. Appl. No. 16/537,513, dated Apr. 1, 2020, 7 pages.
Notice of Allowance in U.S. Appl. No. 15/945,722, dated Apr. 3, 2020, 7 pages.
Non-Final Office Action in U.S. Appl. No. 16/736,971, dated Apr. 7, 2020, 14 pages.
International Search Report and Written Opinion as issued in connection with International Patent Application No. PCT/US2019/013988, mailed Apr. 9, 2020, 8 pages.
Notice of Allowance in US Application No. 16/250, 157 dated Apr. 13, 2020, 8 pages.
Non-Final Office Action in U.S. Appl. No. 16/457,791 dated Apr. 15, 2020, 12 pages.
Non-Final Office Action in U.S. Appl. No. 16/524,950, dated Apr. 16, 2020, 8 pages.
Final Office Action in U.S. Appl. No. 16/736,971, dated Apr. 17, 2020, 6 pages.
International Search Report and Written Opinion as issued in connection with International Patent Application No. PCT/US2020/016253, mailed Apr. 29, 2020, 7 pages.

(56) References Cited

OTHER PUBLICATIONS

Restriction Requirement in U.S. Appl. No. 16/524,967, dated Apr. 29, 2020, 6 pages.
Advisory Action in U.S. Appl. No. 16/736,971, dated May 12, 2020, 5 pages.
Non-Final Office Action in U.S. Appl. No. 16/722,115, dated May 14, 2020, 6 pages.
Extended European Search Report for Application No. 21876672.3, 9 pages.
Notice of Allowance in U.S. Appl. No. 18/493,515 mailed on Nov. 4, 2024, 9 pages.
Restriction Requirement in U.S. Appl. No. 18/642,777, dated Nov. 8, 2024, 7 pages.
Non-Final Office Action in U.S. Appl. No. 18/512,002 dated Dec. 23, 2024, 9 pages.
Kim, Y., et al., "The Design of Inverter Power System for Plasma Generator", 2005 International Conference on Electrical Machines and Systems, vol. 2, pp. 1309-1312 (2005).
First Office Action in CN Patent application No. 201980051988.5 dated Aug. 6, 2024, 22 pages.
Notice of Reason for Refusal for JP Patent Application No. 2023-176000, mailed on Sep. 17, 2024, 4 pages.
Office Action in KR Patent application No. 2023-7031086 dated Oct. 10, 2024, 22 pages.
International Search Report and Written Opinion, as issued in connection with International Patent Application No. PCT/US2024/015658, mailed Aug. 5, 2024, 11 pages.

BIPOLAR HIGH VOLTAGE PULSER

BACKGROUND

High voltage pulsing power supplies have application in a number of fields. But power supplies that produce high voltage pulses at high pulse repetition frequencies are not available due to various technical limitations.

SUMMARY

A bipolar high voltage pulsing power supply is disclosed that can produce high voltage bipolar pulses with a positive high voltage pulse greater than about 200 V followed by a negative high voltage pulse less than about −200 V with a positive to negative dwell period between the positive high voltage pulse and the negative high voltage pulse. A high voltage bipolar pulsing power supply, for example, can reproduce high voltage pulses with a high pulse repetition rate greater than about 10 kHz.

A bipolar high voltage bipolar pulsing power supply, for example, is disclosed that can produce high voltage bipolar pulses with a positive high voltage pulse greater than about 2 kV followed by a negative high voltage pulse less than about −2 kV with a positive to negative dwell period between the positive high voltage pulse and the negative high voltage pulse. A high voltage bipolar pulsing power supply, for example, can reproduce high voltage pulses with a high pulse repetition rate greater than about 10 kHz.

A high voltage bipolar pulsing power supply, for example, is disclosed that includes a DC source; an energy storage capacitor coupled with the DC source; a first high voltage switch electrically coupled with the DC source and the energy storage capacitor; a first diode arranged across the first high voltage switch; a second high voltage switch electrically coupled with the DC source and the energy storage capacitor; a second diode arranged across the second high voltage switch; a third high voltage switch arranged in series between the first high voltage switch and ground; a third diode arranged across the third high voltage switch; a fourth high voltage switch arranged in series between the second high voltage switch and ground; a fourth diode arranged across the fourth high voltage switch; and an output having a first lead electrically coupled between first high voltage switch and the third high voltage switch and the second lead electrically coupled between second high voltage switch and the fourth high voltage switch.

In some examples, the first high voltage switch, the second high voltage switch, the third high voltage switch, and/or the fourth high voltage switch each have a capacitance less than about 10 nF.

In some examples, the first high voltage switch comprises a first plurality of solid state switches arranged in parallel, the second high voltage switch comprises a second plurality of solid state switches arranged in parallel, the third high voltage switch comprises a third plurality of solid state switches arranged in parallel, and/or the fourth high voltage switch comprise a fourth plurality of solid state switches arranged in parallel.

In some examples, the first high voltage switch, the second high voltage switch, the third high voltage switch, and/or the fourth high voltage switch each comprise a switch selected from the group consisting of an IGBT, a MOSFET, a SiC MOSFET, a SiC junction transistor, a FET, a SiC switch, a GaN switch, and a photoconductive switch.

In some examples, the circuit comprising both the DC source and the energy storage capacitor has an inductance less than about 10 nH.

In some examples, the circuit comprising both the first high voltage bipolar pulsing power supply and the second high voltage switch has an inductance less than about 10 nH.

In some examples, the first lead of the output is coupled with a first lead of an electrode and the second lead of the output is coupled with a second lead of the electrode.

The high voltage bipolar pulsing power supply, for example, can also include a first tail sweeper switch and a first tail sweeper resistor arranged in series across the first high voltage switch; a second tail sweeper switch and a second tail sweeper resistor arranged in series across the first high voltage switch; a third tail sweeper switch and a third tail sweeper resistor arranged in series across the first high voltage switch; and a fourth tail sweeper switch and a fourth tail sweeper resistor arranged in series across the first high voltage switch.

A high voltage, multilevel, bipolar pulsing power supply, for example, is disclosed that includes: a first DC source; a first energy storage capacitor coupled with the first DC source; a first diode having an anode and a cathode, the anode electrically coupled with the first DC source and the first energy storage capacitor; a first high voltage switch electrically coupled with the cathode of the first diode; a first diode arranged across the first high voltage switch; a second high voltage switch electrically coupled with the cathode of the first diode; a second diode arranged across the second high voltage switch; a third high voltage switch arranged in series between the first high voltage switch and ground; a third diode arranged across the third high voltage switch; a fourth high voltage switch arranged in series between the second high voltage switch and ground; a fourth diode arranged across the fourth high voltage switch; a second DC source; a second energy storage capacitor coupled with the second DC source; a fifth high voltage switch electrically coupled with the second DC source and the second energy storage capacitor; a fifth diode arranged across the fifth high voltage switch; a sixth high voltage switch electrically coupled with the cathode of the second DC source and the second energy storage capacitor; a sixth diode arranged across the sixth high voltage switch; and an output having a first lead electrically coupled between first high voltage switch and the third high voltage switch and the second lead electrically coupled between second high voltage switch and the fourth high voltage switch.

In some embodiments, the second DC source produces a voltage greater than the first DC source.

In some embodiments, the first high voltage switch, the fourth high voltage switch, and the fifth high voltage switch are closed to produce a voltage at the output equal to a voltage of the second DC source; the second high voltage switch, the third high voltage switch, and the sixth high voltage switch are closed to produce a voltage at the output equal to a negative voltage of the second DC source; the first high voltage switch and the fourth high voltage switch are closed to produce a voltage at the output equal to a voltage of the first DC source; and the second high voltage switch and the third high voltage switch are closed to produce a voltage at the output equal to a negative voltage of the first DC source.

In some examples, the first high voltage switch, the second high voltage switch, the third high voltage switch, the fourth high voltage switch, the fifth high voltage switch, and the sixth high voltage switch each have a capacitance less than about 500 pF.

The high voltage bipolar pulsing power supply, for example, may also include a first tail sweeper switch and a first tail sweeper resistor arranged in series across the first high voltage switch; a second tail sweeper switch and a second tail sweeper resistor arranged in series across the first high voltage switch; a third tail sweeper switch and a third tail sweeper resistor arranged in series across the first high voltage switch; a fourth tail sweeper switch and a fourth tail sweeper resistor arranged in series across the first high voltage switch; a fifth tail sweeper switch and a fifth tail sweeper resistor arranged in series across the fifth high voltage switch; and a sixth tail sweeper switch and a sixth tail sweeper resistor arranged in series across the sixth high voltage switch.

A high voltage, multilevel, bipolar pulsing power supply, for example, is disclosed that includes: a DC source; an energy storage capacitor coupled with the DC source; a diode having an anode and a cathode, the anode electrically coupled with the DC source and the energy storage capacitor; a first high voltage switch electrically coupled with the cathode of the diode; a first diode arranged across the first high voltage switch; a first tail sweeper switch and a first tail sweeper resistor arranged in series across the first high voltage switch; a second high voltage switch electrically coupled with the cathode of the diode; a second diode arranged across the second high voltage switch; a second tail sweeper switch and a second tail sweeper resistor arranged in series across the first high voltage switch; a third high voltage switch arranged in series between the first high voltage switch and ground; a third diode arranged across the third high voltage switch; a third tail sweeper switch and a third tail sweeper resistor arranged in series across the first high voltage switch; a fourth high voltage switch arranged in series between the second high voltage switch and ground; a fourth diode arranged across the fourth high voltage switch; a fourth tail sweeper switch and a fourth tail sweeper resistor arranged in series across the first high voltage switch; and an output having a first lead electrically coupled between first high voltage switch and the third high voltage switch and the second lead electrically coupled between second high voltage switch and the fourth high voltage switch.

In some examples, the first tail sweeper switch is closed prior to the first high voltage switch being closed; the second tail sweeper switch is closed prior to the second high voltage switch being closed; the third tail sweeper switch is closed prior to the third high voltage switch being closed; and the fourth tail sweeper switch is closed prior to the fourth high voltage switch being closed.

In some examples, the first high voltage switch, the second high voltage switch, the third high voltage switch, and the fourth high voltage switch each comprise a switch selected from the group consisting of an IGBT, a MOSFET, a SiC MOSFET, a SiC junction transistor, a FET, a SiC switch, a GaN switch, and a photoconductive switch.

In some examples, the first tail sweeper switch, the second tail sweeper switch, the third tail sweeper switch, and the fourth tail sweeper switch each comprise a switch selected from the group consisting of an IGBT, a MOSFET, a SiC MOSFET, a SiC junction transistor, a FET, a SiC switch, a GaN switch, and a photoconductive switch.

In some examples, the circuit between the diode and both the DC source and the energy storage capacitor has an inductance less than about 10 nH.

In some examples, the circuit between the diode and the first high voltage bipolar pulsing power supply and the second high voltage switch has an inductance less than about 10 nH.

In some examples, the first lead of the output is coupled with a first lead of an electrode and the second lead of the output is coupled with a second lead of the electrode.

The various embodiments and examples described in the summary and this document are provided not to limit or define the disclosure or the scope of the claims.

DETAILED DESCRIPTION

A bipolar high voltage bipolar pulsing power supply is disclosed. A bipolar and high voltage, multilevel bipolar pulsing power supply is also disclosed. A high voltage bipolar pulsing power supply can produce high voltage bipolar pulses that include a positive high voltage pulse greater than about 100 V, 200 V, 500 V, 1 kV, 2 kV, 5 kV, 10 kV, etc. followed by a negative high voltage pulse less than about −100 V, −200 V, −500 V, −1 kV, −2 kV, −5 kV, 10 kV etc. with a positive to negative dwell between the positive high voltage pulse and the negative high voltage pulse. The high voltage bipolar pulsing power supply can reproduce these high voltage pulses with a high pulse repetition rate greater than about 10 kHz.

Figure 1:
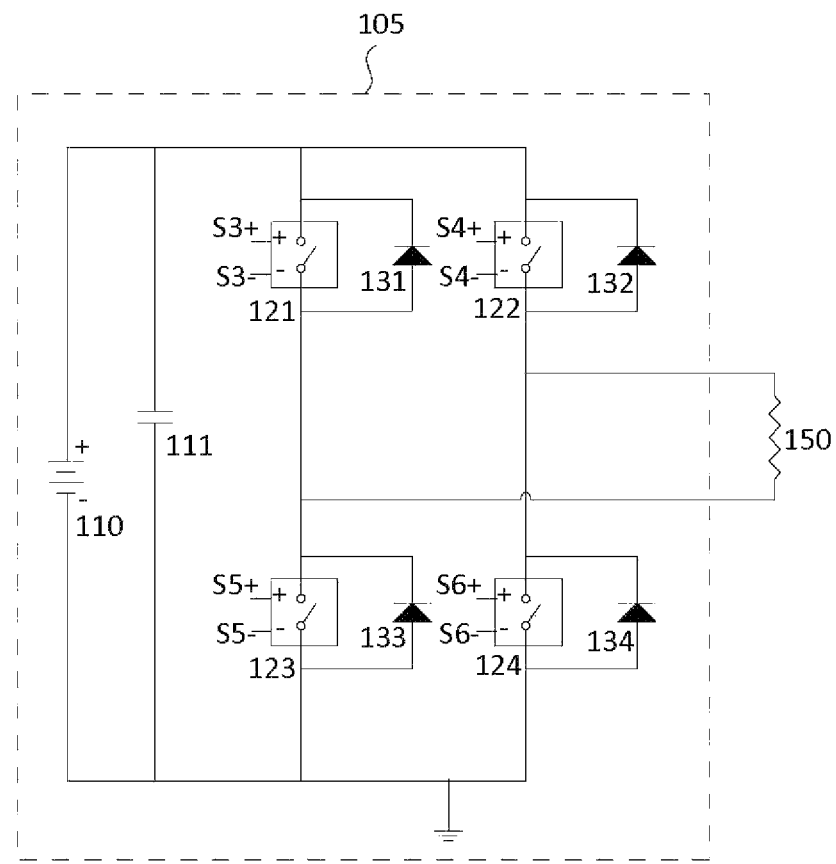
FIG. 1 is an example illustration of a high voltage bipolar pulsing power supply driving a load.

FIG. 1 is an example illustration of a high voltage bipolar pulsing power supply 105 driving a load 150.

The high voltage bipolar pulsing power supply 105 may include a first DC source 110 and an energy storage capacitor 111. The first DC source 110, for example, may include a high voltage bipolar pulsing power supply that charges the energy storage capacitor 111. The energy storage capacitor 111, for example, may include a capacitor having a capacitance of about 80 nF to about 250 nF or about 2 μF to 100 μF.

The high voltage bipolar pulsing power supply 105, for example, may include the first switch circuit 121, the second switch circuit 122, the third switch circuit 123, and the fourth switch circuit 124. Each of the switch circuits 121, 122, 123, or 124, for example, may include a plurality of switches in series or in parallel such as, for example, four switches, eight switches, twelve switches, etc. arranged in parallel.

The first switch circuit 121 may be coupled with the first DC source 110 and a first side of load 150. The third switch circuit 123 may be coupled with ground and the first side of load 150 and first switch circuit 121. The second switch circuit 122 may be coupled with the first DC source 110 and a second side of the load 150. The fourth switch circuit 124 may be coupled with ground, the second side of load 150, and the second switch circuit 122.

Each of the switch circuits 121, 122, 123, and 124, for example, may include one or more of any type of solid-state switch such as, for example, IGBTs, a MOSFETs, a SiC MOSFETs, SiC junction transistors, FETs, SiC switches, GaN switches, photoconductive switches, etc. Each of the switch circuits 121, 122, 123, and 124 may be switched at high frequencies and/or may produce a high voltage pulses. These frequencies may, for example, include frequencies of about 1 kHz, 5 kHz, 10 kHz, 25 kHz, 50 kHz, 100 kHz, etc.

Each switch of the switch circuits 121, 122, 123, and 124 may be coupled in parallel with a respective bridge diode, may have a stray capacitance, and/or may have stray inductance. The stray inductances of each of the switch circuits 121, 122, 123, and 124 may be substantially equal. The stray inductances of each of the switch circuits 121, 122, 123, and 124, for example, may be less than about 5 nH, 10 nH, 50 nH, 100 nH, 150 nH, etc. The stray capacitance of each of the switch circuits 121, 122, 123, and 124, for example, may be low such as, for example, less than about 400 nF, 200 nF, 100 nF, 50 nF, 25 nF, 10 nF, etc. If each switch of the switch circuits 121, 122, 123, and 124 may include multiple individual switches, then the combination of the multiple individual switches may have a capacitance of less than about 150 nF, 100 nF, 50 nF, 25 nF 10 nF, 5 nF, etc.

The combination of a switch (e.g., one of the switch circuits 121, 122, 123, or 124), a respective diode (e.g., one of diodes 131, 132, 133, and 134), and related circuitry may have a stray inductance of less than about 5 nH, 10 nH, 50 nH, 100 nH, 150 nH, etc. The high voltage bipolar pulsing power supply 105 may include low stray inductance throughout the circuit such as, for example, an inductance less than about 5 nH, 10 nH, 50 nH, 100 nH, 150 nH, 200 nH, etc.

The load 150 may comprise any type of load. For example, the load 150 may have an output resistance less than about 250 ohms, 100 ohms, 50 ohms, 25 ohms, 10 ohms, 5 ohms, 2 ohms, 1 ohm, etc. The load 150, for example, may include an electromagnetic coil, a one or two lead electrode, a transformer, etc. The load 150, for example, may be part of a metal 3D printing process, an electrode for ablation, an electrode for electroporation, water purification, etc. The load 150 may include a transformer that may be used to increase the power produced by the high voltage bipolar pulsing power supply 105.

Figure 2A:
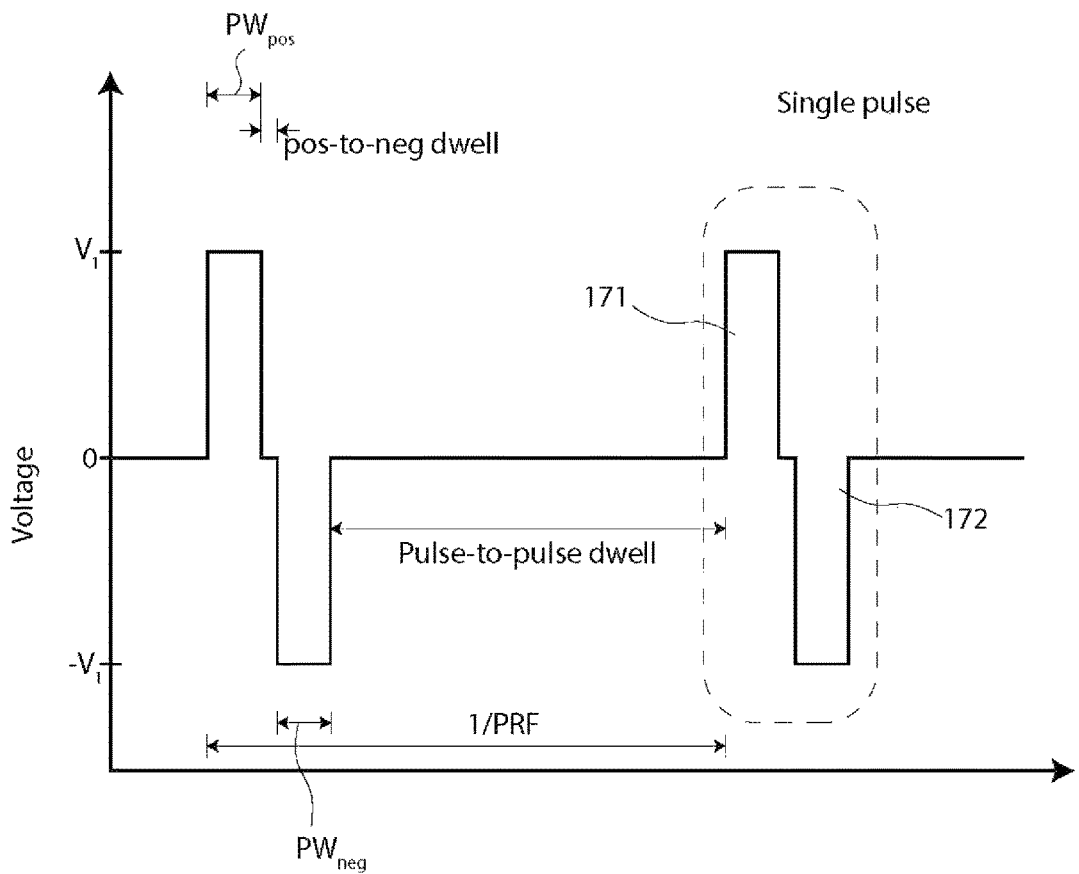
FIG. 2A shows an output waveform at the load from the bipolar pulsing power supply.
Figure 2B:
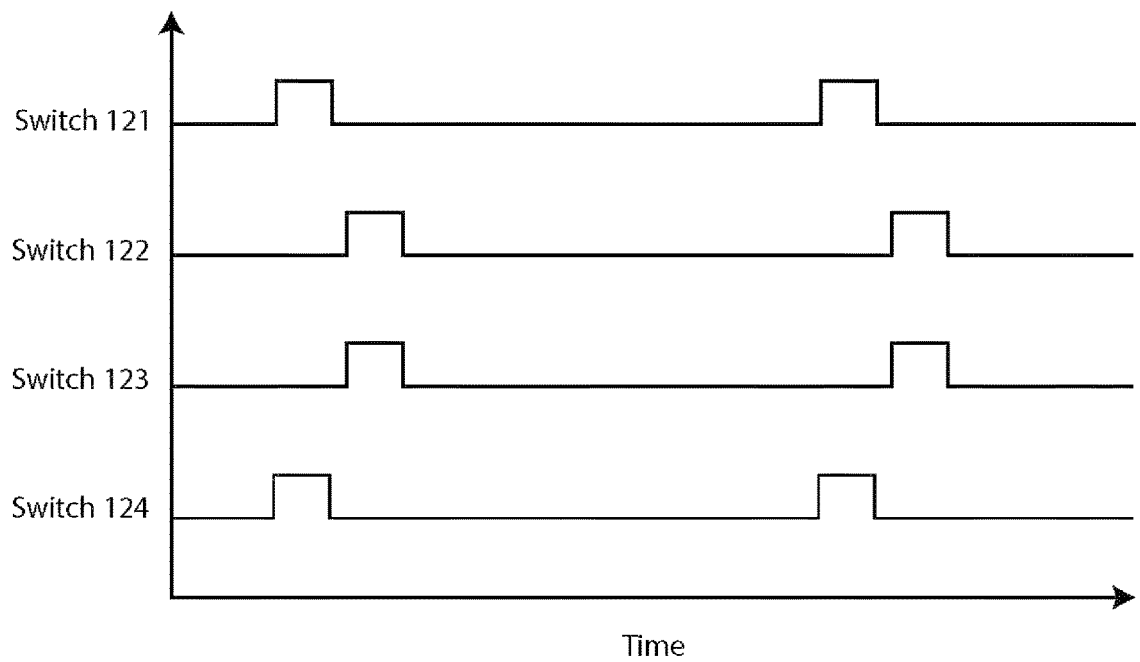
FIG. 2B shows the open and close switch logic of the switches in the bipolar pulsing power supply shown in FIG. 1 to produce the waveforms shown in FIG. 2A.

FIG. 2A shows an output waveform at the load 150 from the high voltage bipolar pulsing power supply 105. FIG. 2B shows the open and close switch logic of the switch circuits 121, 122, 123, and 124 to produce the waveforms shown in FIG. 2A. This output waveform comprises a positive pulse 171 and a negative pulse 172. When the first switch circuit 121 and the fourth switch circuit 124 are closed and the second switch circuit 122 and the third switch circuit 123 are open the positive pulse 171 is formed. When the second switch circuit 122 and the third switch circuit 123 are closed and the first switch circuit 121 and the fourth switch circuit 124 are open the negative pulse 172 is formed.

Each positive pulse 171 in FIG. 2A has a voltage of $V_1$ and each negative pulse 172 in FIG. 2A has a negative voltage of $-V_1$. The voltage $V_1$ is the voltage from the energy storage capacitor 111 and/or the first DC source 110, $V_1$. The time between the positive pulse 171 and the 172 is the dwell. The time between each consecutive positive pulse 171 is the inverse of the pulse repetition frequency (1/PRF). The time between the end of the first negative pulse 172 and the start of the first positive pulse is the pulse-to-pulse dwell. The pulse width of the positive pulse is the $PW_{pos}$ and the pulse width of the negative pulse is the $PW_{neg}$.

Figure 3A:
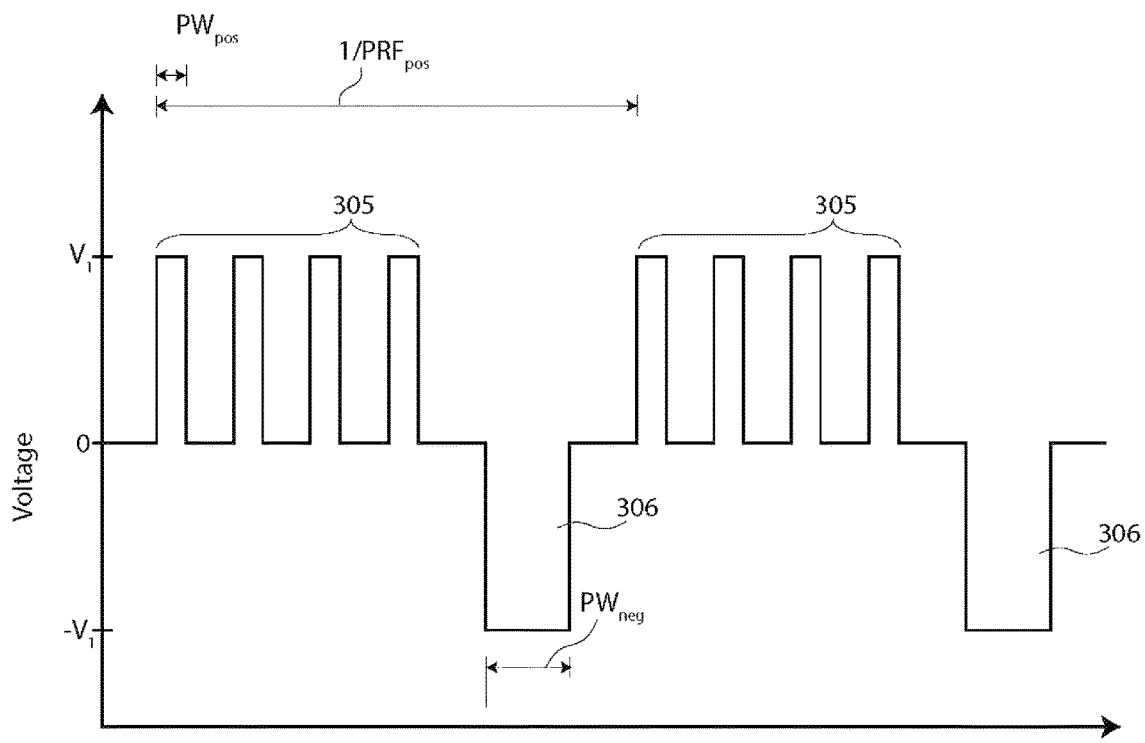
FIG. 3A shows an output waveform at the load from the bipolar pulsing power supply.
Figure 3B:
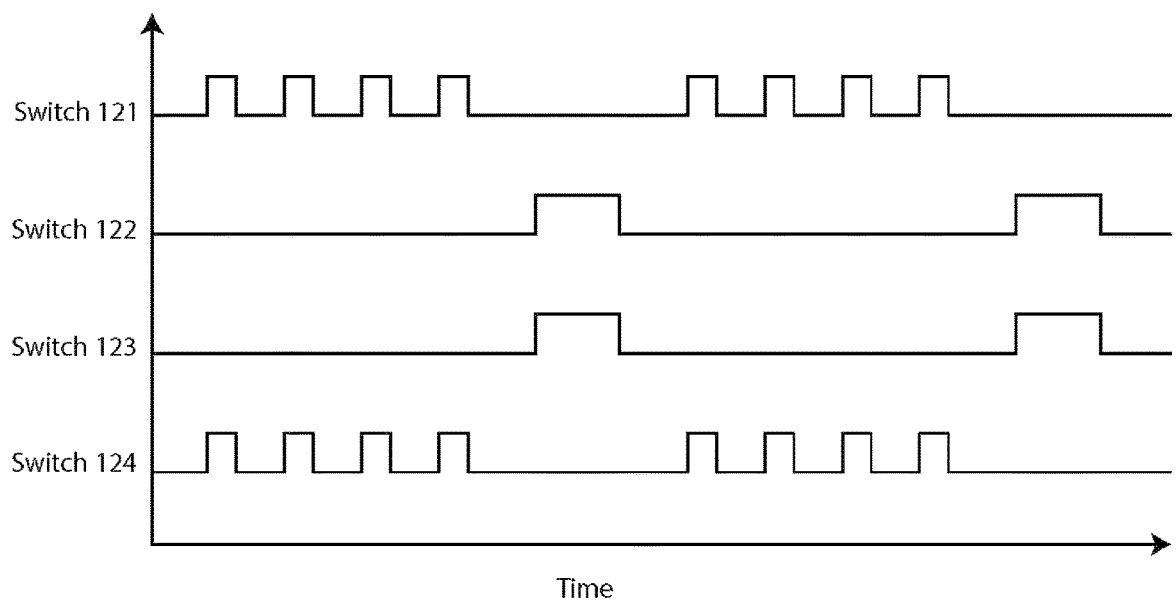
FIG. 3B shows the open and close switch logic of the switches in the bipolar pulsing power supply shown in FIG. 1 to produce the waveforms shown in FIG. 3A.

FIG. 3A shows an output waveform at the load 150 from the high voltage bipolar pulsing power supply 105 with a plurality of positive pulses 305 followed by a negative pulse 306. FIG. 3B shows the open and close switch logic of the switch circuits 121, 122, 123, and 124 to produce the waveforms shown in FIG. 3A. This output waveform comprises a plurality of positive pulses 305 and a longer negative pulse 306. When the first switch circuit 121 and the fourth switch circuit 124 are closed and the second switch circuit 122 and the third switch circuit 123 are open the each one of the plurality of positive pulses 305 are formed. When the second switch circuit 122 and the third switch circuit 123 are closed and the first switch circuit 121 and the fourth switch circuit 124 are open the negative pulse 306 is formed.

Each positive pulse of the plurality of positive pulses 305 in FIG. 3A has a voltage of $V_1$ and each negative pulse 306 in FIG. 3A has a negative voltage of $-V_1$. The voltage $V_1$ is the voltage from the energy storage capacitor 111 and/or the first DC source 110, $V_1$. Each pulse of the plurality of pulses 305 may have a pulse width of $PW_{pos}$, and the pulse width of the negative pulse is the $PW_{neg}$. The time between the first pulse of the plurality of positive pulses 305 and the next first pulse of the plurality of pulses 305 is the pulse repetition frequency (1/PRF).

Figure 4A:
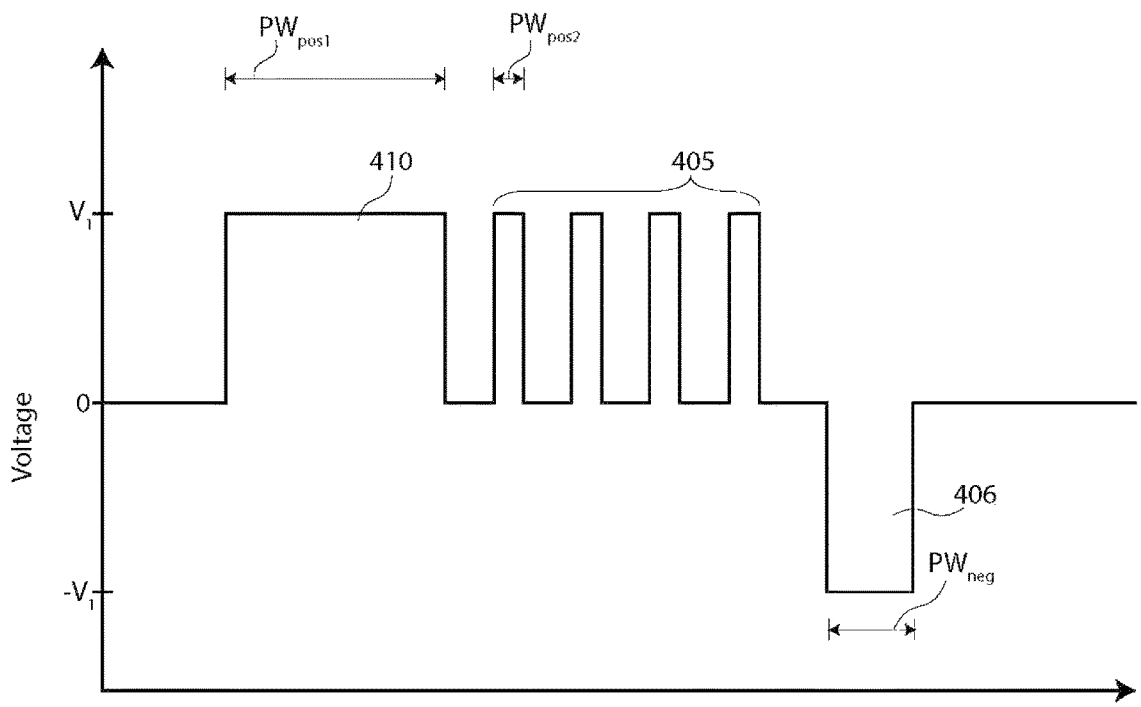
FIG. 4A shows an output waveform at the load from the bipolar pulsing power supply.
Figure 4B:
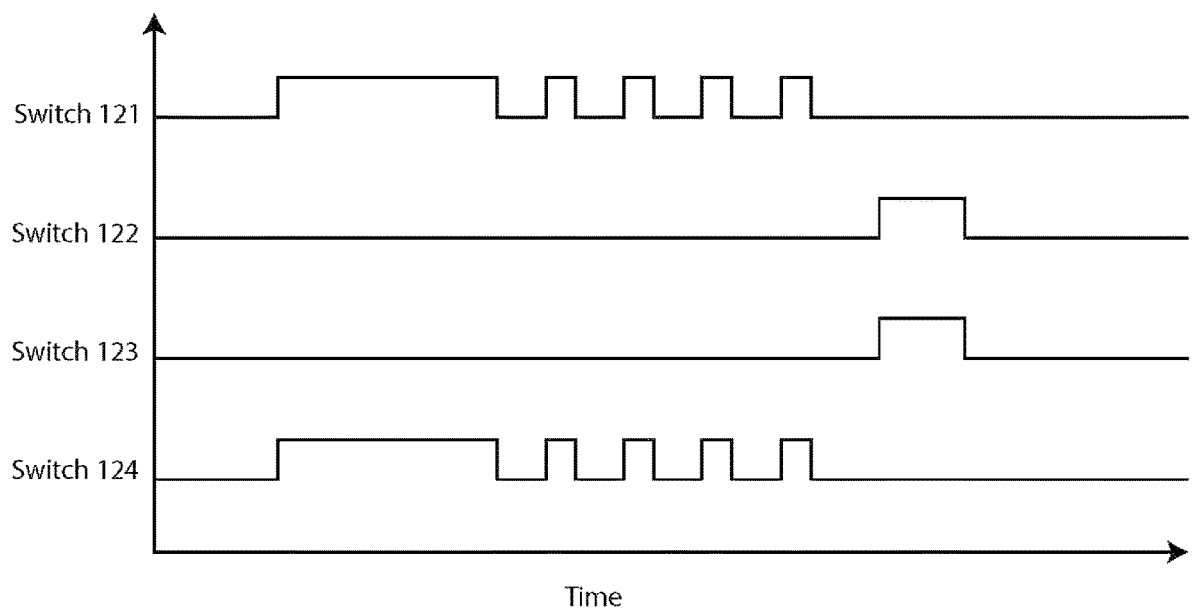
FIG. 4B shows the open and close switch logic of the switches in the bipolar pulsing power supply shown in FIG. 1 to produce the waveforms shown in FIG. 4A.

FIG. 4A shows an output waveform at the load 150 from the bipolar pulsing power supply 105 with a positive first longer pulse 410, a plurality of positive pulses 405 followed by a negative pulse 406. FIG. 3B shows the open and close switch logic of the switch circuits 121, 122, 123, and 124 to produce the waveforms shown in FIG. 4A. When the first switch circuit 121 and the fourth switch circuit 124 are closed and the second switch circuit 122 and the third switch circuit 123 are open the each one of the first positive pulse 410 and the plurality of positive pulses 405 are formed. When the second switch circuit 122 and the third switch circuit 123 are closed and the first switch circuit 121 and the fourth switch circuit 124 are open the negative pulse 406 is formed.

Each positive pulse of the plurality of positive pulses 405 and the long pulse 410 in FIG. 4A has a voltage of $V_1$ and each negative pulse 406 in FIG. 4A has a negative voltage of $-V_1$. The voltage $V_1$ is the voltage from the energy storage capacitor 111 and/or the first DC source 110, $V_1$. Each pulse of the plurality of pulses 405 may have a pulse width of $PW_{pos2}$, the long positive pulse 410 may have a pulse width of $PW_{pos1}$, and the pulse width of the negative pulse is the $PW_{neg}$. The pulse width $PW_{pos1}$ of the long pulse may be longer than the pulse width $PW_{pos2}$ of each of the plurality of positive pulses 405 such as, for example, substantially more than two, three, four, five, ten, twenty, fifty, one hundred, five hundred, etc. times as long, The time between the first pulse of the plurality of positive pulses 305 and the next first pulse of the plurality of pulses 305 is the pulse repetition frequency (1/PRF).

Figure 5:
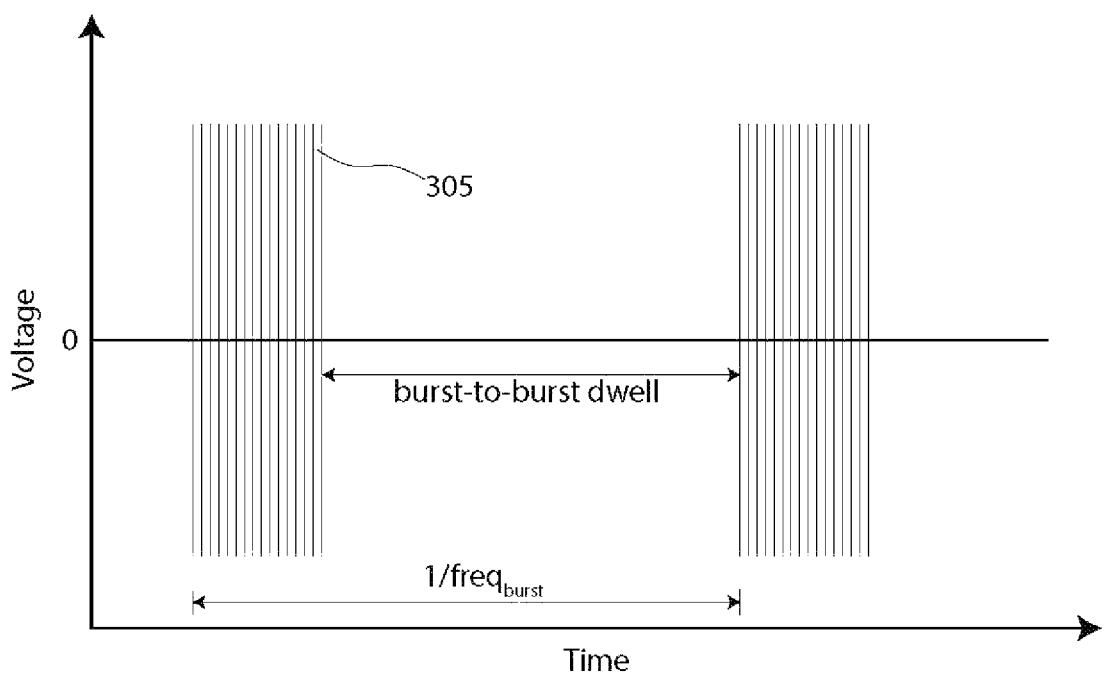
FIG. 5 shows output burst waveforms from a bipolar pulsing power supply.

As shown in FIG. 5, the high voltage bipolar pulsing power supply 105 can produce burst pulses 305 that includes a plurality of bipolar pulses. The time between consecutive bursts is the burst-to-burst dwell and the time between the start of a first burst and the start of a second burst is the inverse of burst frequency (1/freq$_{burst}$).

A controller (e.g., computational system 1300) may be coupled with each switch (e.g., the first switch circuit 121, the second switch circuit 122, the third switch circuit 123, and the fourth switch circuit 124) may control the opening and closing of these switch circuits. The controller may control the switch circuits to produce the waveforms shown in FIG. 2A by opening closing the switch circuits as shown in FIG. 2B. The controller may control the timing of the switch circuits to produce the waveforms shown in FIG. 3.

The controller can control the switch circuits to produce long pulse widths with a low pulse repetition frequency (PRF). For example, the controller can close the first switch circuit 121 and the fourth switch circuit 124 for a long duration (e.g., 5 ms, 2.5 ms, 1 ms, 500 ns, etc.), then open the first switch circuit 121 and the fourth switch circuit 124 and close the second switch circuit 122 and the third switch circuit 123 for a long duration (e.g., 5 ms, 2.5 ms, 1 ms, 500 ns, etc.), and then open the second switch circuit 122 and the third switch circuit 123. The controller can repeat this process after any period of time such as, for example, a pulse repetition frequency of 1 kHz, 10 kHz, 100 kHz, etc.

The controller can control the switch circuits to produce a plurality of short pulses (e.g., 250 ns, 500 ns, 1 ms, 5 ms, etc.) with a high pulse repetition frequency (e.g., 1 kHz, 5 kHz, 10 kHz, 25 kHz, etc.) within a burst and repeat the burst after a period of time (e.g., 250 ms, 500 ms, 1 s, 3 s, 5 s, etc.) such as, for example, as shown in FIG. 3. The controller can repeat these bursts, for example, hundreds or thousands of times.

Figure 6:
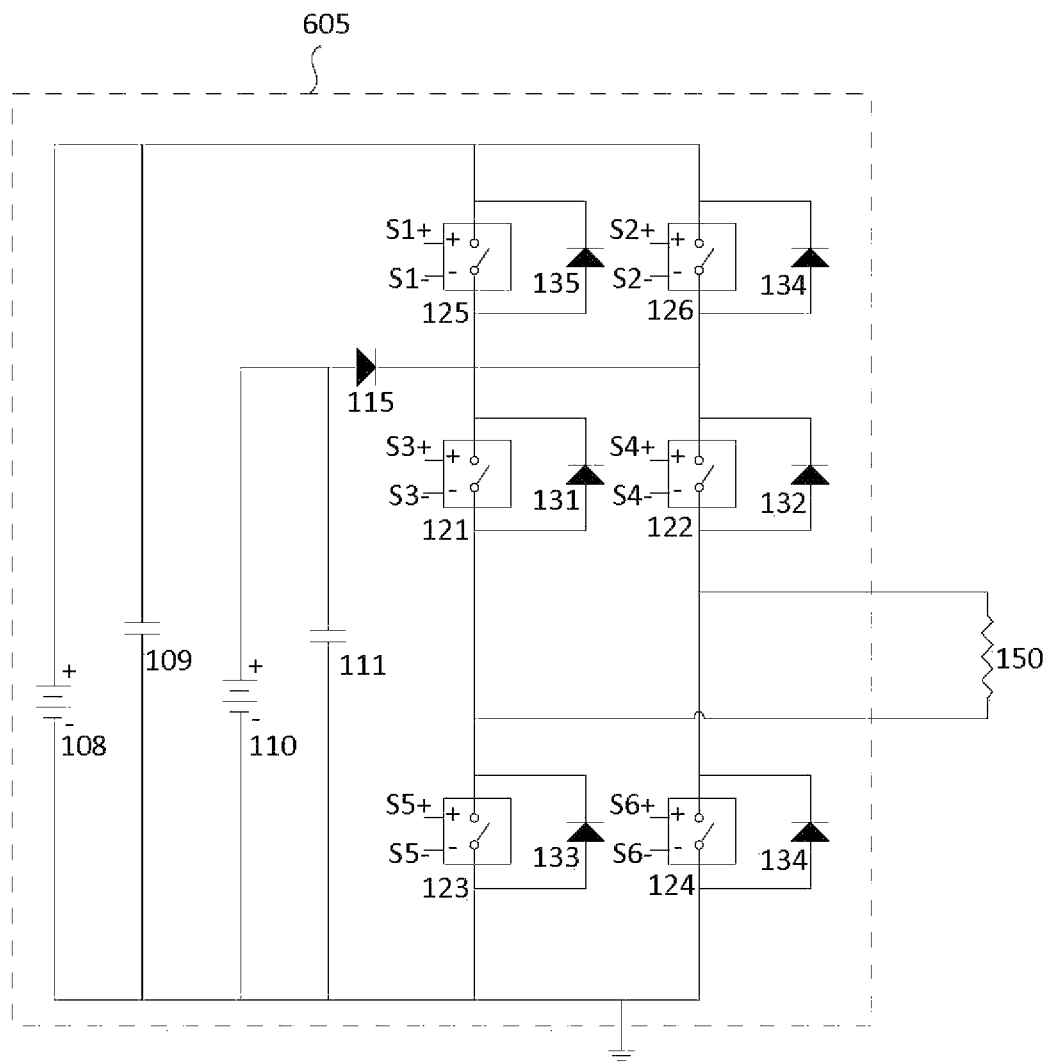
FIG. 6 is an example illustration of a high voltage, bipolar, multilevel, bipolar pulsing power supply driving a load.

FIG. 6 shows an example high voltage, multilevel, bipolar pulsing power supply 605 driving the load 150. The high voltage, multilevel, bipolar pulsing power supply 605 includes the high voltage bipolar pulsing power supply 105 and a fifth switch circuit 125 with a corresponding diode 135, a sixth switch circuit 126 with a corresponding diode 136, a second DC source 108, and a second energy storage capacitor 109. The fifth switch circuit 125 is coupled between the second DC source 108 and the first switch circuit 121. The sixth switch circuit 126 is coupled between the second DC source 108 and the second switch circuit 122. A diode may be included between the second DC source 108 and the fifth switch circuit 125 and between the second DC source 108 and the sixth switch circuit 126.

The second DC source 108 can produce a voltage greater than the first DC source 110.

Figure 7A:
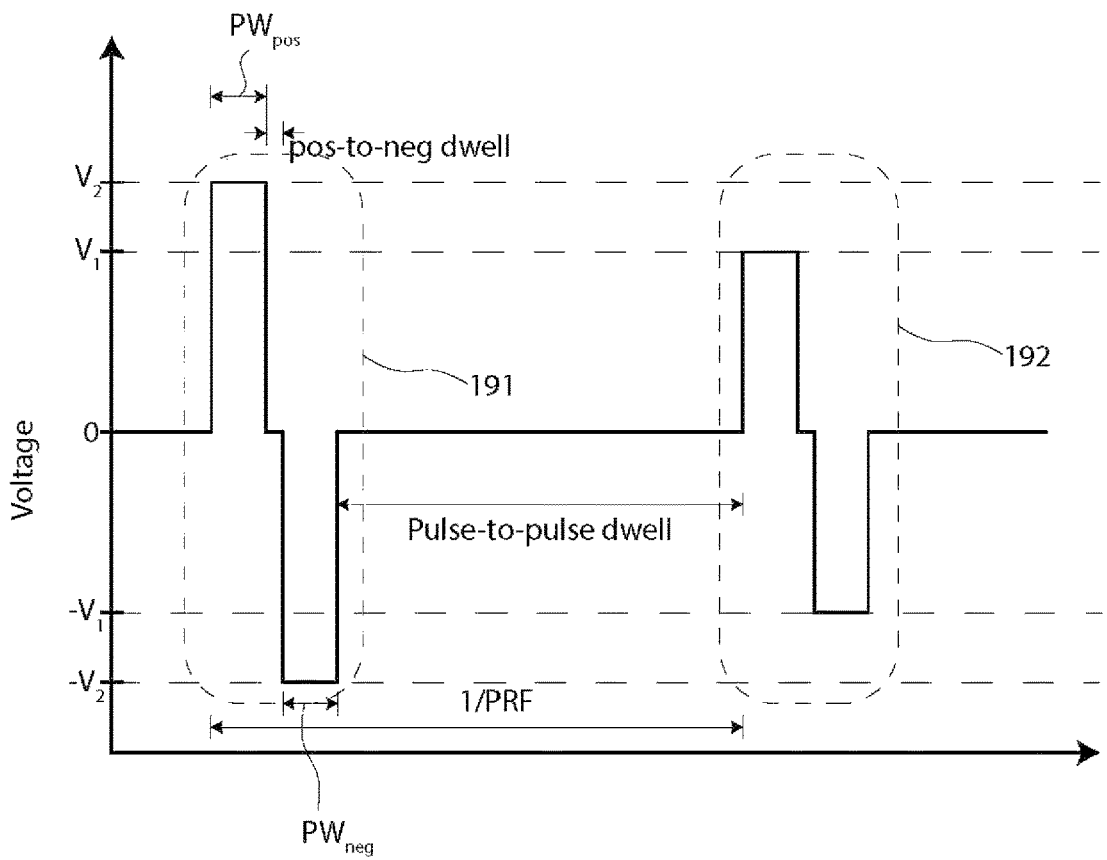
FIG. 7A shows an output waveform at the load from the bipolar, multilevel, pulsing power supply.
Figure 8A:
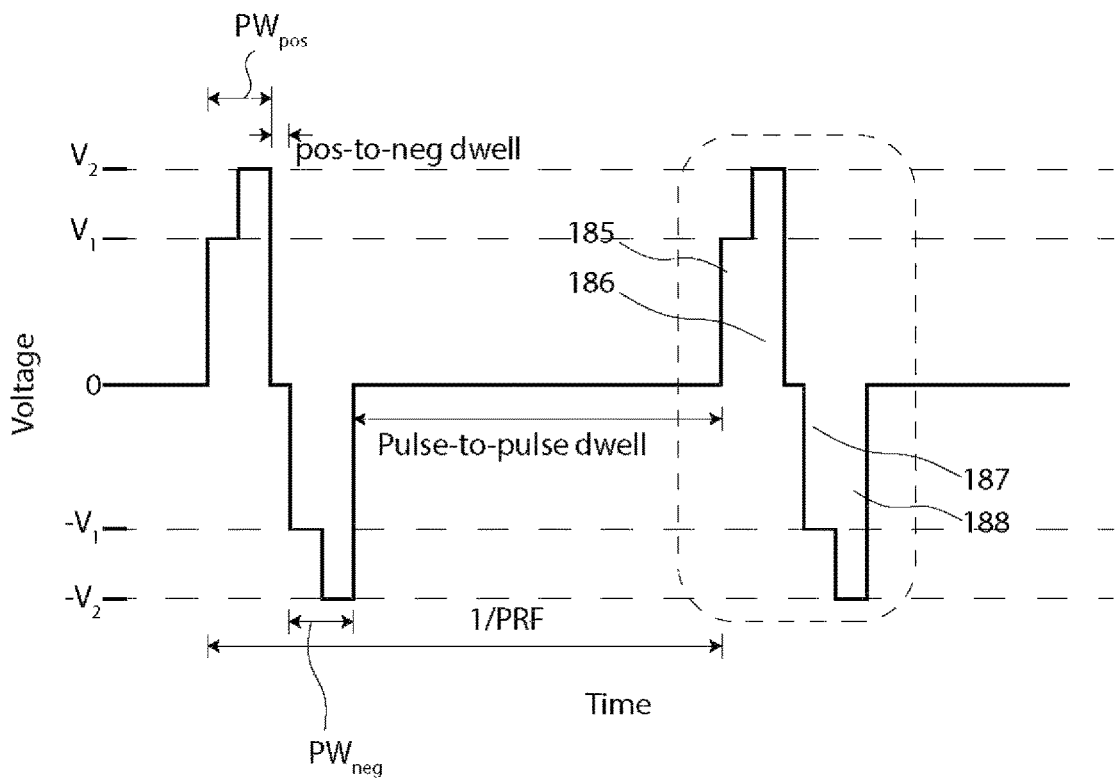
FIG. 8A shows an output waveform at the load from the bipolar, multilevel, pulsing power supply.

The diode 115 ensures charge flows from the energy storage capacitor 111, through the closed switch circuits, either the first switch circuit 121 and the fourth switch circuit 124 or the second switch circuit 122 and the third switch circuit 123 to the load 150. The high voltage, multilevel, bipolar pulsing power supply 605 can produce either 1) bipolar pulses with a high voltage as shown in FIG. 7A or 2) bipolar and multilevel pulses as shown in FIG. 8A. In FIG. 7A the first pulse 191 has a voltage of $V_1$, which is the voltage of first DC source 110, and the second pulse 192 has a voltage $V_2$, which is the voltage of the second DC source 108.

Figure 7B:
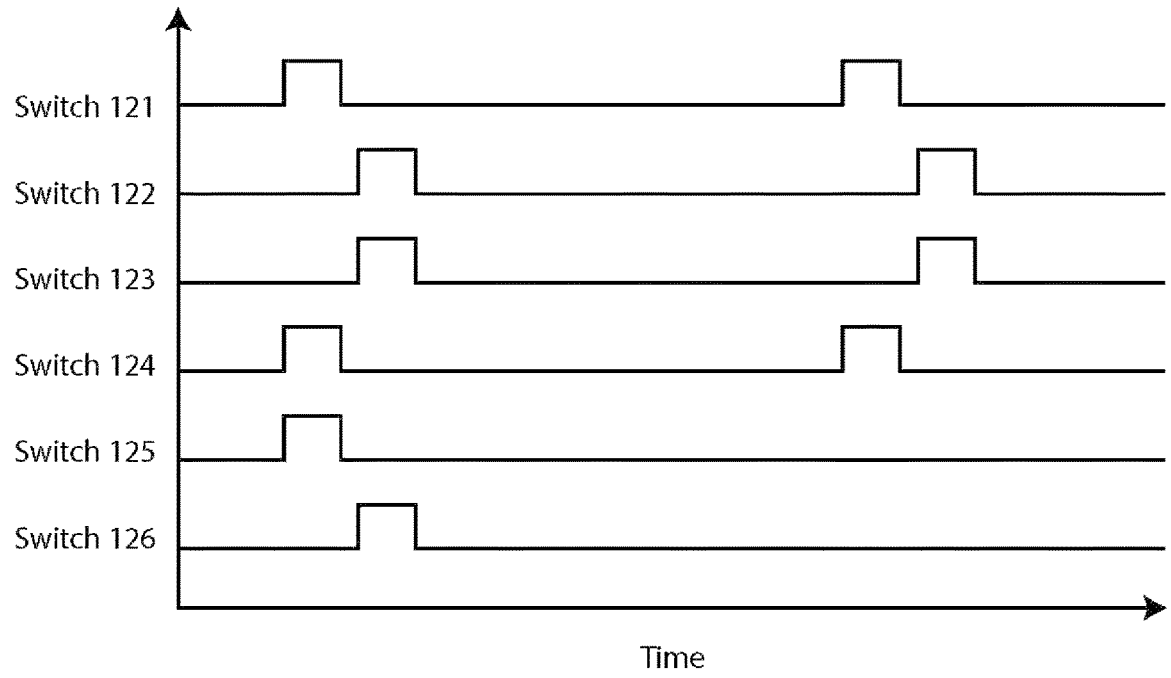
FIG. 7B shows the open and close switch logic of the switches in the bipolar, multilevel, pulsing power supply shown in FIG. 6 to produce the waveforms shown in FIG. 7A.

FIG. 7B shows the shows the open and close switch logic of the switch 121, 122, 123, 124, 125, and 126, to produce the bipolar waveforms shown in FIG. 7A. The positive portion of the first pulse 191 is formed with a voltage $V_2$, when the fifth switch circuit 125, the first switch circuit 121, and the fourth switch circuit 124 are closed and the sixth switch circuit 126, the second switch circuit 122 and the third switch circuit 123 are open. The negative portion of the first pulse 191 is formed with a voltage $V_2$, when the sixth switch circuit 126, the second switch circuit 122, and the third switch circuit 123 are closed and the fifth switch circuit 125, the first switch circuit 121, and the fourth switch circuit 124 are open. The positive portion of the second pulse 192 is formed with a voltage $V_1$, when the first switch circuit 121 and the fourth switch circuit 124 are closed and the sixth switch circuit 126, the second switch circuit 122, the fifth switch circuit 125, and the third switch circuit 123 are open. The negative portion of the second pulse 192 is formed with a voltage $V_2$, when the second switch circuit 122 and the third switch circuit 123 are closed and the fifth switch circuit 125, the sixth switch circuit 126, the first switch circuit 121, and the fourth switch circuit 124 are open.

Figure 8B:
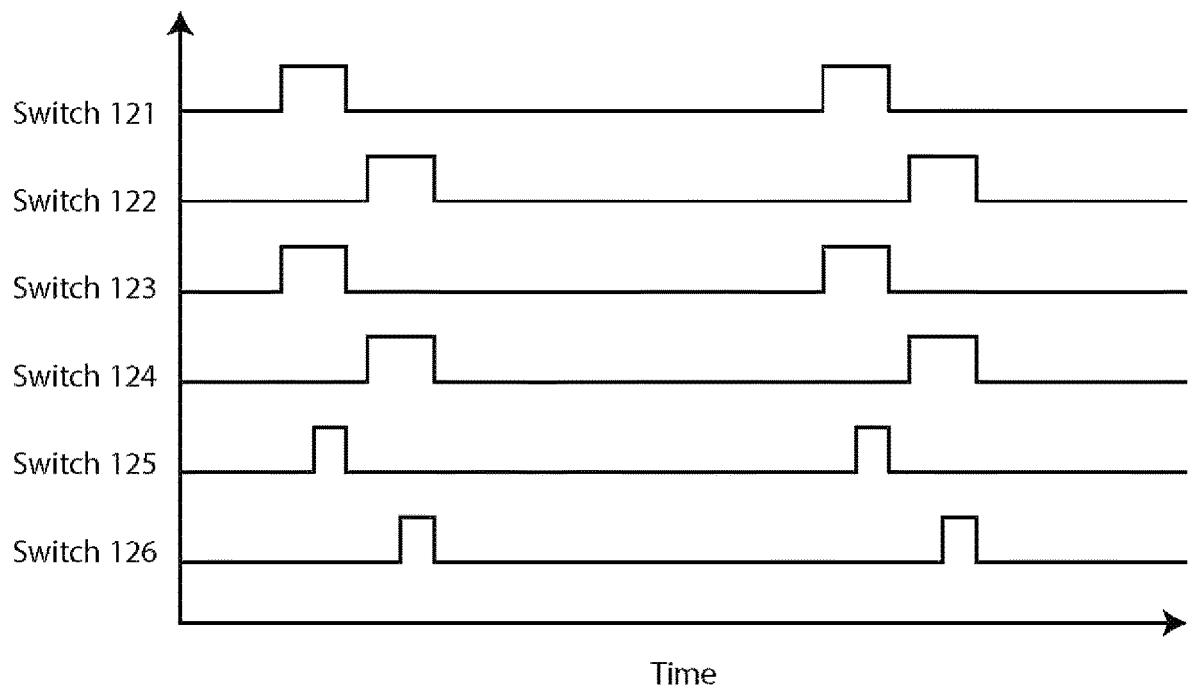
FIG. 8B shows the open and close switch logic of the switches in the bipolar, multilevel, pulsing power supply shown in FIG. 6 to produce the waveforms shown in FIG. 8A.

FIG. 8B shows the shows the open and close switch logic of the switch circuits 121, 122, 123, 124, 125, and 126 to produce the multilevel bipolar waveforms shown in FIG. 8A. When the first switch circuit 121 and the fourth switch circuit 124 are closed and the fifth switch circuit 125, the sixth switch circuit 126, the second switch circuit 122, and the third switch circuit 123 are open, first level positive pulse 185 is formed at voltage $V_1$. When the switch, 125, the first switch circuit 121 and the fourth switch circuit 124 are closed and the sixth switch circuit 126, the second switch circuit 122, and the third switch circuit 123 are open, the second level positive pulse 186 is formed at voltage $V_2$. The combination of the first level positive pulse 185 and the second level positive pulse 186 forms a multilevel positive pulse. When the second switch circuit 122 and the third switch circuit 123 are closed and the fifth switch circuit 125, the sixth switch circuit 126, the first switch circuit 121, and the fourth switch circuit 124 are open, the first level negative pulse 187 is formed at voltage $-V_1$. When the switch, 126, the second switch circuit 122, and the third switch circuit 123 are closed and the fifth switch circuit 125, the first switch circuit 121, and the fourth switch circuit 124 are open, second level negative pulse 188 is formed at voltage $-V_2$. The combination of the first level negative pulse 187 and the second level negative pulse 188 forms a multilevel negative pulse. The $V_2$ is the voltage of the second DC source 108.

Figure 9A:
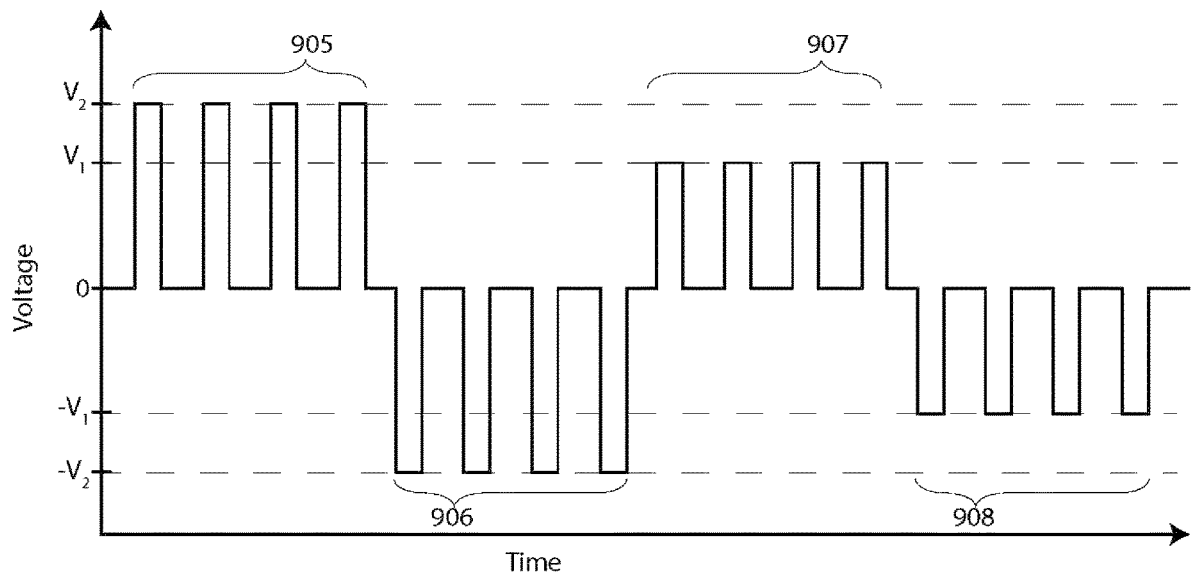
FIG. 9A shows an output waveform at the load from the bipolar, multilevel, pulsing power supply.
Figure 9B:
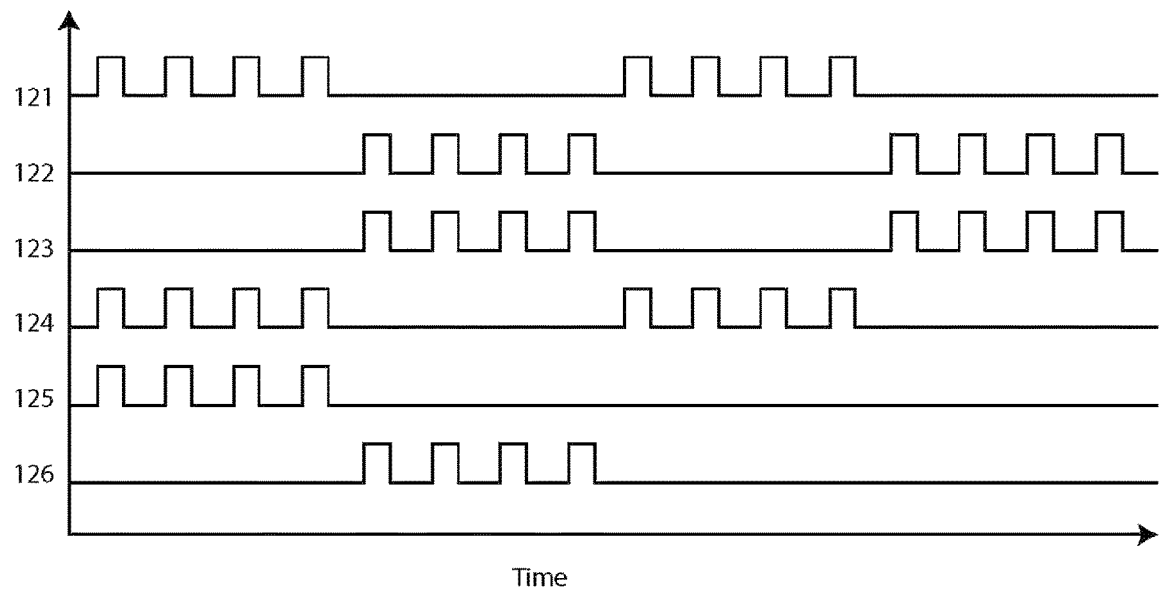
FIG. 9B shows the open and close switch logic of the switches in the bipolar, multilevel, pulsing power supply shown in FIG. 6 to produce the waveforms shown in FIG. 8A.

FIG. 9B shows the shows the open and close switch logic of the switch circuits 121, 122, 123, 124, 125, and 126 to produce the multilevel bipolar waveforms shown in FIG. 9A. FIG. 9A shows a first burst of pulses 905 having a voltage $V_2$, a second burst of pulses 906 having a negative voltage $V_2$, a third burst of pulses 907 having a voltage $V_1$, and a fourth burst of pulses 908 having a negative voltage $V_1$. The first burst of pulses 905 may include any number of pulses; the second burst of pulses 906 may include any number of pulses; the third burst of pulses 907 may include any number of pulses; and/or the fourth burst of pulses 908 may include any number of pulses. The bursts of pulses may occur in any order or sequence. The first burst of pulses 905, the second plurality of pulses 906, the third plurality of pulses 907, and/or the fourth plurality of pulses 908 may have any pulse repetition frequency and/or each pulse of the plurality of pulses may have any pulse widths.

The first burst of pulses 905 with a voltage $V_2$ may be created by closing the first switch circuit 121, the fourth switch circuit 124, and the fifth switch circuit 125; and opening the second switch circuit 122, the third switch circuit 123, and the sixth switch circuit 126. The second burst of pulses 906 with a negative voltage $V_2$ may be created by closing the second switch circuit 122, the third switch circuit 123, and the sixth switch circuit 126; and opening the first switch circuit 121, the fourth switch circuit 124, and the fifth switch circuit 125. The third burst of pulses 907 with a voltage $V_1$ may be created by closing the first switch circuit 121 and the fourth switch circuit 124; and opening the second switch circuit 122, the third switch circuit 123, the fifth switch 125, and the sixth switch 126. The fourth burst of pulses 908 with a negative voltage $V_1$ may be created by closing the second switch circuit 122 and the third switch circuit 123; and opening the first switch circuit 121, the fourth switch circuit 124, the fifth switch 125, and the sixth switch 126.

Figure 10:
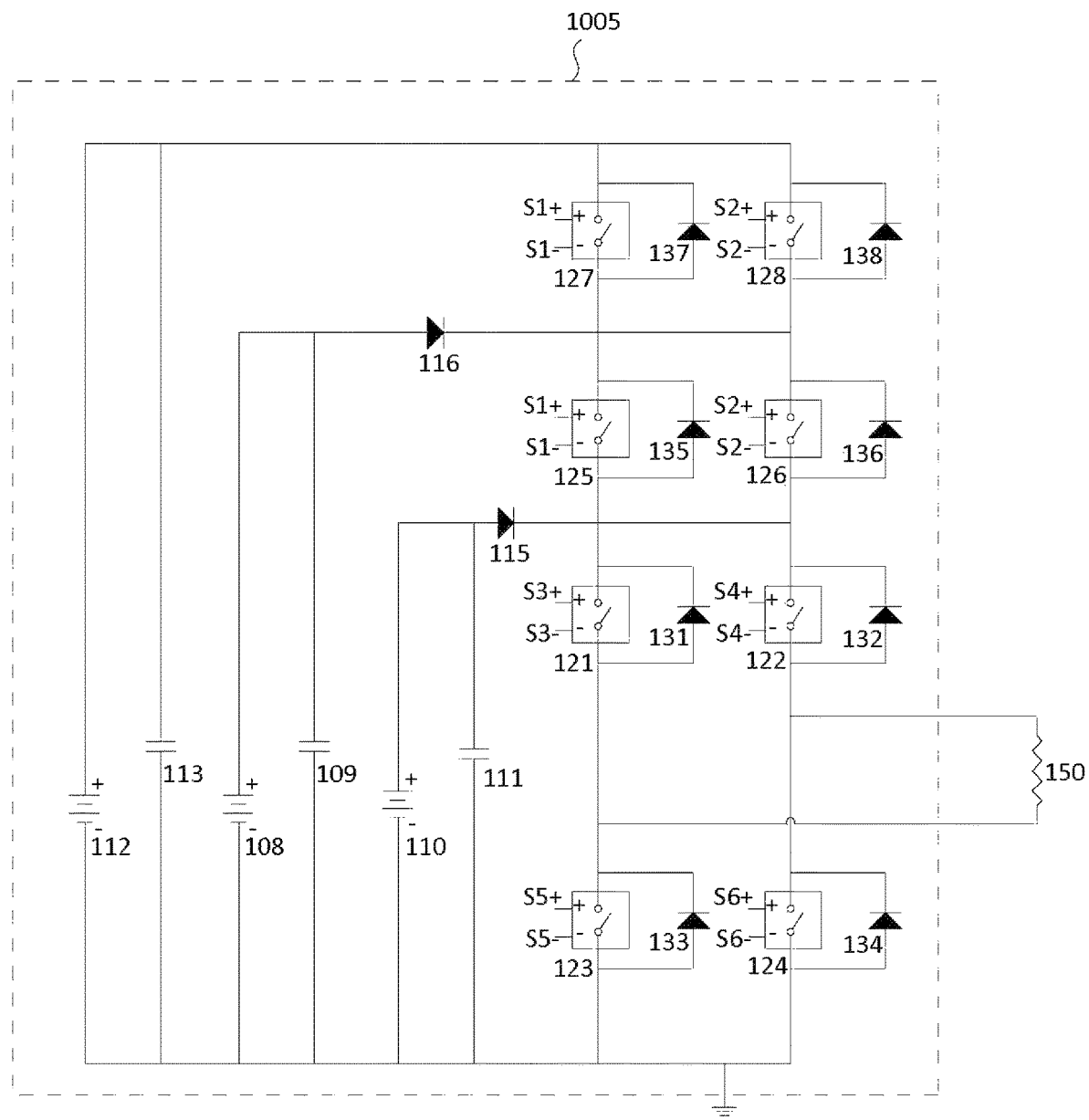
FIG. 10 is an example illustration of a high voltage, bipolar, multilevel, bipolar pulsing power supply driving a load.

The bipolar pulsing power supply 605 may include additional switch circuit to produce additional multilevel pulses. FIG. 10 shows an example high voltage, multilevel, bipolar pulsing power supply 1005 with a seventh switch circuit 127 and an eighth switch circuit 128 coupled with a third DC source 112 and a third energy storage capacitor 113. The seventh switch circuit 127 may include a corresponding diode 137 and the eighth switch circuit 128 may include a corresponding diode 138. An additional diode 116 may also be included between the second DC source 108 and the second energy storage capacitor 109 and both the fifth switch circuit 125 and the sixth switch circuit 126. The third DC source 112 may have a voltage greater than the first DC source 110 and/or the second DC source 108. The high voltage bipolar pulsing power supply 1005 may produce multilevel pulses with three levels of voltage.

Additional DC sources and switch circuits may be added to create additional multilevel pulses of any number of voltage levels.

Figure 11:
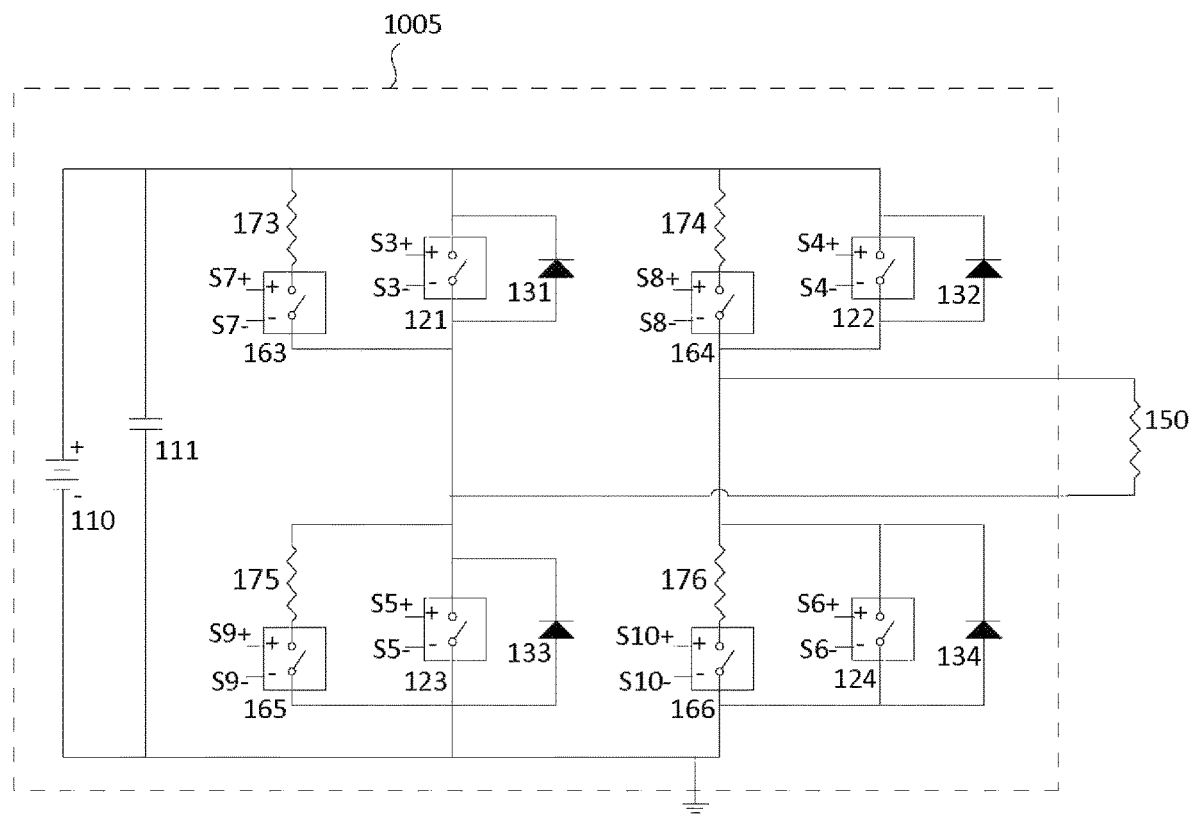
FIG. 11 is an example illustration of a high voltage bipolar pulsing power supply driving a load.

FIG. 11 shows an example high voltage bipolar pulsing power supply 1005 driving the load 150. In this example, the high voltage bipolar pulsing power supply 105 includes four tail sweeper switches (e.g., switches 163, 164, 165, 166) and corresponding tail sweeper resistors (e.g., resistors 173, 174, 175, and 176). Alternatively, the tail sweeper resistors can be replaced with inductors or capacitors.

The first tail sweeper switch 163 and the first tail sweeper resistor 173 are coupled across the first switch circuit 121, the second tail sweeper switch 164 and the second tail sweeper resistor 174 are coupled across the second switch circuit 122, the third tail sweeper switch 165 and the third tail sweeper resistor 175 are coupled across the third switch circuit 123, and the fourth tail sweeper switch 166 and the fourth tail sweeper resistor 176 are coupled across the fourth switch circuit 124. Each tail sweeper switch can be closed prior to the corresponding switch circuit to dissipate any tail current in the circuit into the tail sweeper resistor as shown in FIG. 12B.

Figure 12A:
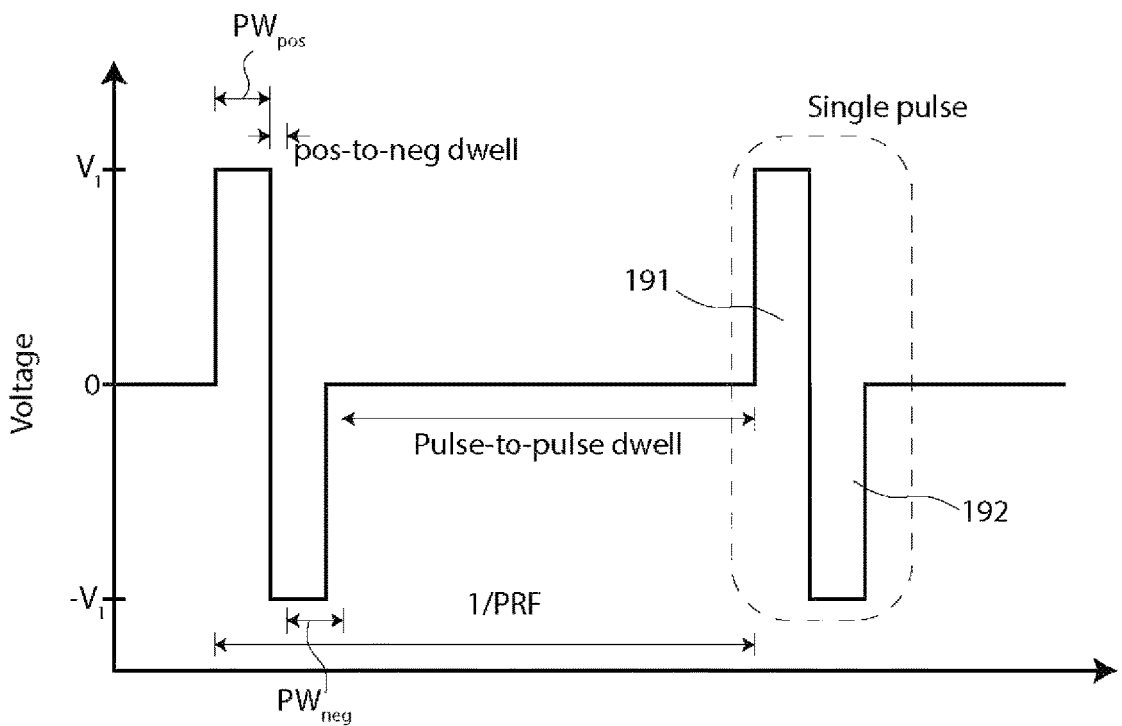
FIG. 12A shows an output waveform at the load from the bipolar, pulsing power supply shown in FIG. 11.
Figure 12B:
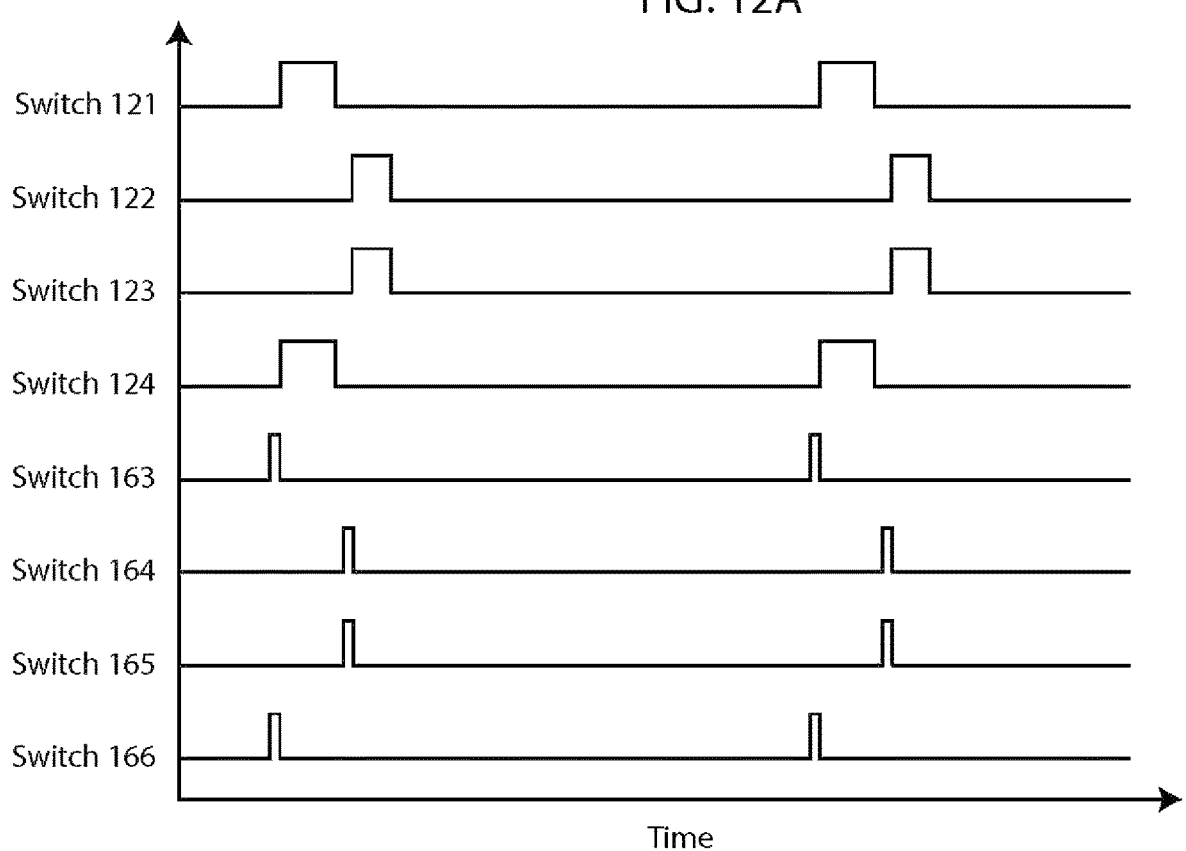
FIG. 12B shows the open and close switch logic of the switches in the bipolar, pulsing power supply shown in FIG. 11 to produce the waveforms shown in FIG. 12A.

FIG. 12A shows bipolar pulses produced with the high voltage bipolar pulsing power supply 1005. FIG. 12B shows the shows the open and close switch logic of the switch circuits 121, 122, 123, 124, 125, and 126 and/or the tail sweeper switches 163, 164, 165, and 166 to produce the bipolar waveforms shown in FIG. 12A. For example, the tail sweeper switch 163 and the tail sweeper switch 166 are closed prior to closing the first switch circuit 121 and the fourth switch circuit 124. And the tail sweeper switch 164 and the tail sweeper switch 165 are closed prior to closing the second switch circuit 122 and the third switch circuit 123. By closing the tail sweeper switch 164 and the tail sweeper switch 165 prior to closing the second switch circuit 122 and the third switch circuit 123, the dwell between the positive pulse 191 and the negative pulse 192 can be substantially eliminated or completely eliminated.

Figure 13:
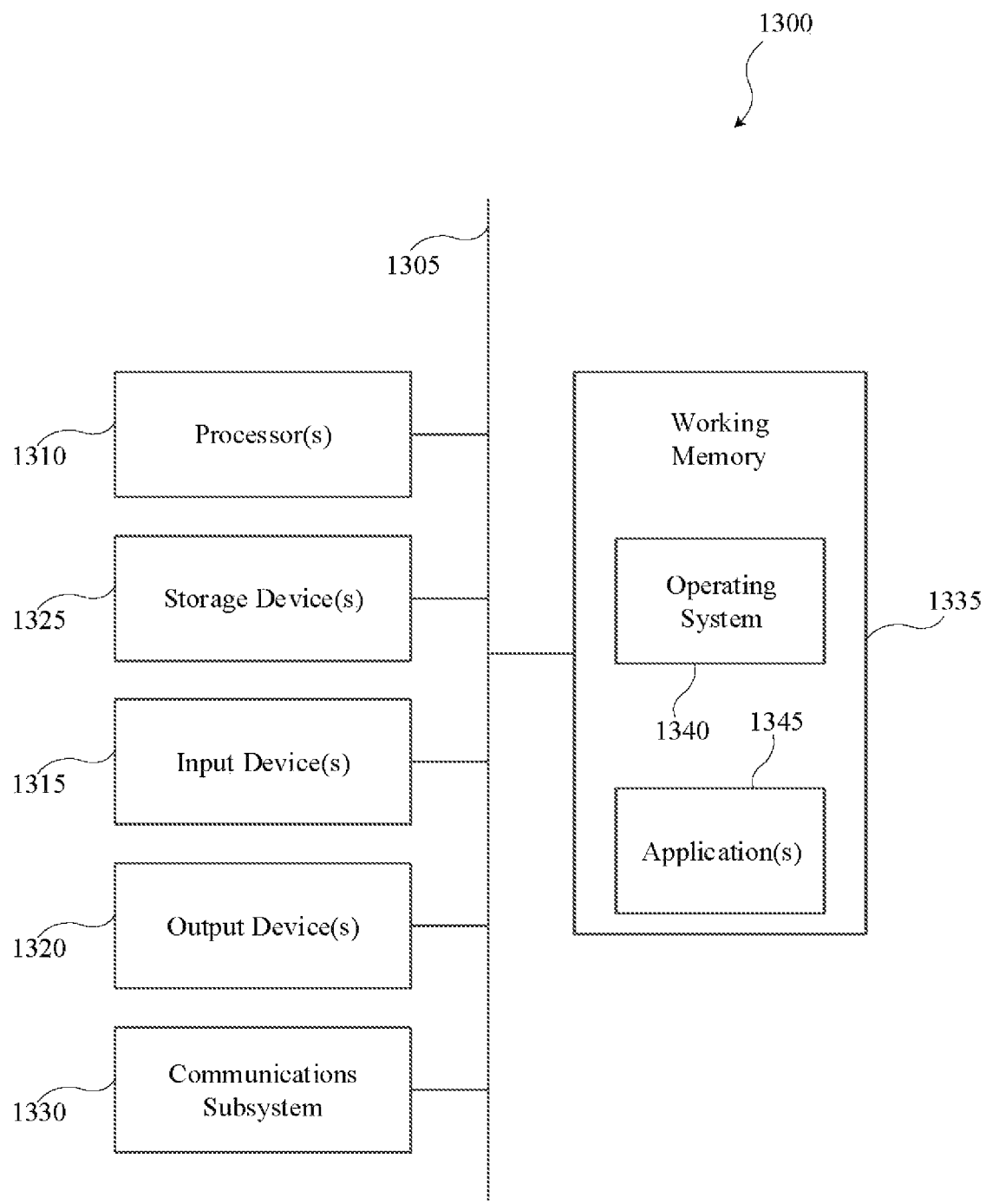
FIG. 13 is a block diagram of a computational system that can be used to with or to perform some embodiments described in this document.

The computational system 1300, shown in FIG. 13 can be used to perform any of the embodiments of the invention. For example, computational system 1300 can be used to control the switching of the various switch circuits described in this document. As another example, computational system 1300 can perform any calculation, identification and/or determination described here. The computational system 1300 may include hardware elements that can be electrically coupled via a bus 1305 (or may otherwise be in communication, as appropriate). The hardware elements can include one or more processors 1310, including without limitation one or more general-purpose processors and/or one or more special-purpose processors (such as digital signal processing chips, graphics acceleration chips, and/or the like); one or more input devices 1315, which can include without limitation a mouse, a keyboard and/or the like; and one or more output devices 1320, which can include without limitation a display device, a printer and/or the like.

The computational system 1300 may further include (and/or be in communication with) one or more storage devices 1325, which can include, without limitation, local and/or network accessible storage and/or can include, without limitation, a disk drive, a drive array, an optical storage device, a solid-state storage device, such as a random access memory ("RAM") and/or a read-only memory ("ROM"), which can be programmable, flash-updateable and/or the like. The computational system 1300 might also include a communications subsystem 1330, which can include without limitation a modem, a network card (wireless or wired), an infrared communication device, a wireless communication device and/or chipset (such as a Bluetooth device, an 802.6 device, a Wi-Fi device, a WiMax device, cellular communication facilities, etc.), and/or the like. The communications subsystem 1330 may permit data to be exchanged with a network (such as the network described below, to name one example), and/or any other devices described in this document. In many embodiments, the computational system 1300 will further include a working memory 1335, which can include a RAM or ROM device, as described above.

The computational system 1300 also can include software elements, shown as being currently located within the working memory 1335, including an operating system 1340 and/or other code, such as one or more application programs 1345, which may include computer programs of the invention, and/or may be designed to implement methods of the invention and/or configure systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 1325 described above.

In some cases, the storage medium might be incorporated within the computational system 1300 or in communication with the computational system 1300. In other embodiments, the storage medium might be separate from a computational system 1300 (e.g., a removable medium, such as a compact disc, etc.), and/or provided in an installation package, such that the storage medium can be used to program a general-purpose computer with the instructions/code stored thereon. These instructions might take the form of executable code, which is executable by the computational system 1300 and/or might take the form of source and/or installable code, which, upon compilation and/or installation on the computational system 1300 (e.g., using any of a variety of generally available compilers, installation programs, compression/decompression utilities, etc.) then takes the form of executable code.

Unless otherwise specified, the term "substantially" means within 5% or 10% of the value referred to or within manufacturing tolerances. Unless otherwise specified, the term "about" means within 5% or 10% of the value referred to or within manufacturing tolerances.

The conjunction "or" is inclusive.

The terms "first", "second", "third", etc. are used to distinguish respective elements and are not used to denote a particular order of those elements unless otherwise specified or order is explicitly described or required.

Numerous specific details are set forth to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A high voltage bipolar pulsing power supply comprising:
    a DC source;
    an energy storage capacitor coupled with the DC source;
    a first high voltage switch electrically coupled with the DC source and the energy storage capacitor;
    a first diode arranged across the first high voltage switch;
    a second high voltage switch electrically coupled with the DC source and the energy storage capacitor;
    a second diode arranged across the second high voltage switch;
    a third high voltage switch arranged in series between the first high voltage switch and ground;
    a third diode arranged across the third high voltage switch;
    a fourth high voltage switch arranged in series between the second high voltage switch and ground;
    a fourth diode arranged across the fourth high voltage switch; and
    an output having a first lead electrically coupled between the first high voltage switch and the third high voltage switch and a second lead electrically coupled between the second high voltage switch and the fourth high voltage switch, the output providing a plurality of high voltage pulses where each pulse of the plurality of pulses includes a positive pulse having a voltage greater than about 500 volts and a negative pulse having a negative voltage less than about 500 volts, and wherein the output produces a waveform having a repeating pattern of a plurality of positive pulses followed by one or more negative pulses.

2. The high voltage bipolar pulsing power supply according to claim 1, wherein the output high voltage pulses with a pulse repetition rate greater than about 10 kHz.

3. The high voltage bipolar pulsing power supply according to claim 1, wherein the first high voltage switch comprises a first plurality of solid state switches arranged in parallel, the second high voltage switch comprises a second plurality of solid state switches arranged in parallel, the third high voltage switch comprises a third plurality of solid state switches arranged in parallel, and the fourth high voltage switch comprise a fourth plurality of solid state switches arranged in parallel.

4. The high voltage bipolar pulsing power supply according to claim 1, wherein the first high voltage switch, the second high voltage switch, the third high voltage switch, and the fourth high voltage switch each comprise a switch selected from the group consisting of an IGBT, a MOSFET, a SiC MOSFET, a SiC junction transistor, a FET, a SiC switch, a GaN switch, and a photoconductive switch.

5. The high voltage bipolar pulsing power supply according to claim 1, wherein the circuit comprising both the DC source and the energy storage capacitor has an inductance less than about 10 nH.

6. The high voltage bipolar pulsing power supply according to claim 1, wherein a circuit comprising the first high voltage switch and the first diode has an inductance less than about 10 nH.

7. The high voltage bipolar pulsing power supply according to claim 1, further comprising:
    a first tail sweeper switch and a first tail sweeper resistor arranged in series across the first high voltage switch;
    a second tail sweeper switch and a second tail sweeper resistor arranged in series across the first high voltage switch;
    a third tail sweeper switch and a third tail sweeper resistor arranged in series across the first high voltage switch; and
    a fourth tail sweeper switch and a fourth tail sweeper resistor arranged in series across the first high voltage switch.

8. A high voltage, multilevel, bipolar pulsing power supply comprising:
    a first DC source;

a first energy storage capacitor coupled with the first DC source;
a diode having an anode and a cathode, the anode electrically coupled with the first DC source and the first energy storage capacitor;
a first high voltage switch electrically coupled with the cathode of the first diode;
a first diode arranged across the first high voltage switch;
a second high voltage switch electrically coupled with the cathode of the first diode and ground;
a second diode arranged across the second high voltage switch;
a third high voltage switch arranged in series between the first high voltage switch
a third diode arranged across the third high voltage switch;
a fourth high voltage switch arranged in series between the second high voltage switch and ground;
a fourth diode arranged across the fourth high voltage switch; and
an output having a first lead electrically coupled between the first high voltage switch and the third high voltage switch and a second lead electrically coupled between the second high voltage switch and the fourth high voltage switch, and wherein the output produces a waveform having multilevel positive pulses followed by a negative pulse.

9. The high voltage, multilevel, bipolar pulsing power supply according to claim 8, wherein the output provides a plurality of high voltage pulses each pulse of the plurality of high voltage pulses having a first positive pulse with a voltage greater than 500 volts, a second high pulse with a positive voltage greater than the voltage of the first positive pulse, and a negative pulse with a voltage less than −500 volts.

10. The high voltage, multilevel, bipolar pulsing power supply according to claim 8, wherein the second DC source produces a voltage greater than the first DC source.

11. The high voltage, multilevel, bipolar pulsing power supply according to claim 8, wherein:
the first high voltage switch, the fourth high voltage switch, and the fifth high voltage switch are closed to produce a voltage at the output equal to a voltage of the second DC source;
the second high voltage switch, the third high voltage switch, and the sixth high voltage switch are closed to produce a voltage at the output equal to a negative voltage of the second DC source;
the first high voltage switch and the fourth high voltage switch are closed to produce a voltage at the output equal to a voltage of the first DC source; and
the second high voltage switch and the third high voltage switch are closed to produce a voltage at the output equal to a negative voltage of the first DC source.

12. The high voltage bipolar pulsing power supply according to claim 11, wherein the first high voltage switch, the second high voltage switch, the third high voltage switch, the fourth high voltage switch, the fifth high voltage switch, and the sixth high voltage switch each have a capacitance less than about 500 pF.

13. The high voltage bipolar pulsing power supply according to claim 12, further comprising:
a first tail sweeper switch and a first tail sweeper resistor arranged in series across the first high voltage switch;
a second tail sweeper switch and a second tail sweeper resistor arranged in series across the first high voltage switch;
a third tail sweeper switch and a third tail sweeper resistor arranged in series across the first high voltage switch;
a fourth tail sweeper switch and a fourth tail sweeper resistor arranged in series across the first high voltage switch;
a fifth tail sweeper switch and a fifth tail sweeper resistor arranged in series across the fifth high voltage switch; and
a sixth tail sweeper switch and a sixth tail sweeper resistor arranged in series across the sixth high voltage switch.

14. The high voltage, multilevel, bipolar pulsing power supply according to claim 8, further comprising:
a second DC source;
a second energy storage capacitor coupled with the second DC source;
a fifth high voltage switch electrically coupled with the second DC source and the second energy storage capacitor;
a fifth diode arranged across the fifth high voltage switch;
a sixth high voltage switch electrically coupled with the cathode of the second DC source and the second energy storage capacitor; and
a sixth diode arranged across the sixth high voltage switch.

15. The high voltage, multilevel, bipolar pulsing power supply according to claim 8, wherein the negative pulse is a multilevel negative pulse.

16. A high voltage bipolar pulsing power supply comprising:
a DC source;
an energy storage capacitor coupled with the DC source;
a diode having an anode and a cathode, the anode electrically coupled with the DC source and the energy storage capacitor;
a first high voltage switch electrically coupled with the cathode of the diode;
a first diode arranged across the first high voltage switch;
a first tail sweeper switch and a first tail sweeper resistor arranged in series across the first high voltage switch;
a second high voltage switch electrically coupled with the cathode of the diode;
a second diode arranged across the second high voltage switch;
a second tail sweeper switch and a second tail sweeper resistor arranged in series across the first high voltage switch;
a third high voltage switch arranged in series between the first high voltage switch and ground;
a third diode arranged across the third high voltage switch;
a third tail sweeper switch and a third tail sweeper resistor arranged in series across the first high voltage switch;
a fourth high voltage switch arranged in series between the second high voltage switch and ground;
a fourth diode arranged across the fourth high voltage switch;
a fourth tail sweeper switch and a fourth tail sweeper resistor arranged in series across the first high voltage switch; and
an output having a first lead electrically coupled between the first high voltage switch and the third high voltage switch and a second lead electrically coupled between the second high voltage switch and the fourth high voltage switch, the output providing a plurality of high voltage pulses where each pulse of the plurality of pulses includes a positive pulse having a voltage greater than about 500 volts and a negative pulse having a negative voltage less than about −500 volts, and wherein the output produces a waveform having multilevel positive pulses followed by a negative pulse.

17. The high voltage bipolar pulsing power supply according to claim 16, wherein:
the first tail sweeper switch is closed prior to the first high voltage switch being closed;
the second tail sweeper switch is closed prior to the second high voltage switch being closed;
the third tail sweeper switch is closed prior to the third high voltage switch being closed; and
the fourth tail sweeper switch is closed prior to the fourth high voltage switch being closed.

18. The high voltage bipolar pulsing power supply according to claim 16, wherein the first high voltage switch, the second high voltage switch, the third high voltage switch, and the fourth high voltage switch each comprise a switch selected from the group consisting of an IGBT, a MOSFET, a SiC MOSFET, a SiC junction transistor, a FET, a SiC switch, a GaN switch, and a photoconductive switch.

19. The high voltage bipolar pulsing power supply according to claim 16, wherein the first tail sweeper switch, the second tail sweeper switch, the third tail sweeper switch, and the fourth tail sweeper switch each comprise a switch selected from the group consisting of an IGBT, a MOSFET, a SiC MOSFET, a SiC junction transistor, a FET, a SiC switch, a GaN switch, and a photoconductive switch.

20. The high voltage bipolar pulsing power supply according to claim 16, wherein the circuit between the diode and both the DC source and the energy storage capacitor has an inductance less than about 10 nH.

21. The high voltage bipolar pulsing power supply according to claim 16, wherein a circuit comprising the first high voltage switch and the first diode has an inductance less than about 10 nH.

22. The high voltage, multilevel, bipolar pulsing power supply according to claim 16, wherein the negative pulse is a multilevel negative pulse.

* * * * *